(12) United States Patent
Dewa et al.

(10) Patent No.: US 10,540,234 B2
(45) Date of Patent: Jan. 21, 2020

(54) DRIVE APPARATUS FOR SWITCH

(71) Applicant: DENSO CORPORATION, Kariya, Aichi-pref. (JP)

(72) Inventors: Tetsuya Dewa, Kariya (JP); Yosuke Asako, Kariya (JP); Tomotaka Suzuki, Kariya (JP); Kazunori Watanabe, Kariya (JP); Yohei Kondo, Kariya (JP); Junji Miyachi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/267,662

(22) Filed: Feb. 5, 2019

(65) Prior Publication Data

US 2019/0243715 A1    Aug. 8, 2019

(30) Foreign Application Priority Data

Feb. 6, 2018   (JP) .................. 2018-019247

(51) Int. Cl.
| | |
|---|---|
| H03K 3/00 | (2006.01) |
| G06F 11/14 | (2006.01) |
| H03K 3/017 | (2006.01) |
| H03K 7/08 | (2006.01) |
| H03K 17/94 | (2006.01) |

(52) U.S. Cl.
CPC ......... *G06F 11/1443* (2013.01); *H03K 3/017* (2013.01); *H03K 7/08* (2013.01); *H03K 17/94* (2013.01)

(58) Field of Classification Search
CPC .... H03K 3/017; H03K 7/08; H03K 19/00361; H03K 17/04126; H03K 17/063; H03K 17/0822; H03K 17/567; H03K 17/04123; H03K 17/6877; H03K 17/94; H04L 25/028; G06F 11/1443
See application file for complete search history.

(56) References Cited

U.S. PATENT DOCUMENTS

| | | | | |
|---|---|---|---|---|
| 8,884,660 | B2 * | 11/2014 | Fukuta ................ | H03K 17/00 327/109 |
| 2014/0062361 | A1 * | 3/2014 | Suzuki ................ | H02M 1/08 318/400.17 |
| 2017/0310243 | A1 | 10/2017 | Asako et al. | |

FOREIGN PATENT DOCUMENTS

JP    2014-016227 A    1/2014

* cited by examiner

*Primary Examiner* — Long Nguyen
(74) *Attorney, Agent, or Firm* — Oliff PLC

(57) ABSTRACT

In a drive apparatus, a transmission unit mounted to a first region stops transmission of a pulse signal from a physical-quantity transmission terminal. The transmission unit transmits, from the failure information transmission terminal, a first signal indicative of an occurrence of the failure associated with the target switch when it is determined that the failure associated with the target switch has occurred, and transmits, from the physical-quantity transmission terminal, a second signal indicative of a content of the failure associated with the target switch. A controller mounted to a second region electrically isolated from the first region detects, based on the pulse signal from the physical-quantity transmission terminal, the physical quantity upon no input of the first signal to the controller. The controller identifies, based on the second signal transmitted from the physical-quantity transmission terminal, the content of the failure upon the first signal being input to the controller.

8 Claims, 16 Drawing Sheets

$$\left(Duty = \frac{TH}{Ts} \times 100\right)$$

$$\left( \begin{array}{l} \cdot Tc = \dfrac{Ts}{2} \\ \cdot DtyC = \dfrac{TH}{Tc} \times 100 \end{array} \right)$$

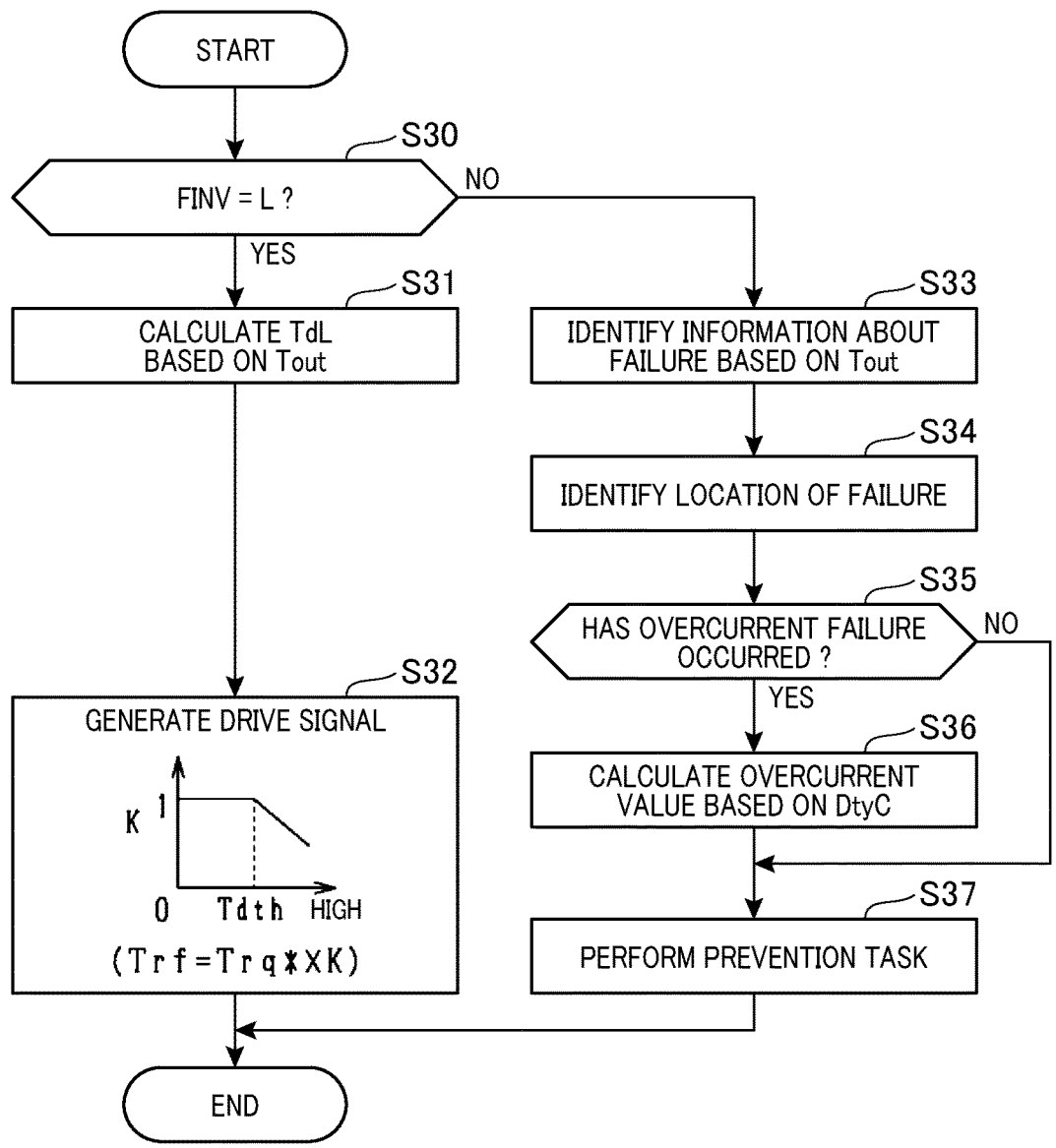

DRIVE APPARATUS FOR SWITCH

CROSS REFERENCE TO RELATED APPLICATION

This application is based on and claims the benefit of priority from Japanese Patent Application No. 2018-019247 filed on Feb. 6, 2018, the disclosure of which is incorporated in its entirety herein by reference.

TECHNICAL FIELD

The present disclosure relates to drive apparatuses for a switch.

BACKGROUND

Such a drive apparatus for a switch includes a controller and a drive circuit disclosed in, for example, Japanese Patent Application Publication No. 2014-16227. The drive circuit is configured to obtain a signal that is used to drive the switch and has a correlation with a physical quantity of a predetermined detection target. The drive circuit is also configured to perform a pulse-width modulation (PWM) of the obtained signal to thereby generate a cyclic pulse signal having a controlled duty factor. The drive circuit is also configured to transmit the cyclic pulse signal to the controller via at least one transmission terminal thereof, so that the controller obtains, based on the cyclic pulse signal, the physical quantity of the detection target.

The drive apparatus includes a first circuit region serving as a high-voltage region in which the drive circuit with the at least on transmission terminal is provided. The drive apparatus also includes a second circuit region that is electrically isolated from the first circuit region; the controller is provided in the second circuit region.

SUMMARY

Any failure or malfunction associated with the switch in the drive circuit results in the drive circuit having to send, via an additional transmission terminal, the information about the failure from the first circuit region to the controller in the second circuit region. This may increase the number of transmission terminals of the drive circuit to the controller.

From this viewpoint, one aspect of the present disclosure seeks to provide drive apparatuses for a switch, each of which is capable of addressing the issue set forth above.

Specifically, an alternative aspect of the present disclosure aims to provide such drive apparatuses, each of which is capable of transmitting, from a drive circuit for a switch to a controller, information about a failure associated with the switch without an additional transmission terminal for transmission of the information about the failure to the controller.

According to an exemplary aspect of the present disclosure, there is provided a drive apparatus, having a first region and a second region electrically isolated from the first region, for driving a target switch. The drive apparatus includes an obtaining unit mounted to the first region and configured to obtain a signal used for drive of the target switch, the signal representing a physical quantity associated with a physical characteristic of the target switch. The drive apparatus includes a physical-quantity transmission terminal mounted to the first region, and a modulator mounted to the first region and configured to perform pulse-width modulation of the signal obtained by the obtaining unit to thereby output a pulse signal from the physical-quantity transmission terminal. The drive apparatus includes a failure information transmission terminal mounted to the first region, a failure determiner mounted to the first region and configured to determine whether a failure associated with the target switch has occurred, and a transmission unit mounted to the first region and configured to stop transmission of the pulse signal from the physical-quantity transmission terminal.

The transmission unit is configured to (1) Transmit, from the failure information transmission terminal, a first signal indicative of an occurrence of the failure associated with the target switch when it is determined that the failure associated with the target switch has occurred (2) Transmit, from the physical-quantity transmission terminal, a second signal indicative of a content of the failure associated with the target switch The drive apparatus includes a controller mounted to the second region and configured to (1) Detect, based on the pulse signal from the physical-quantity transmission terminal, the physical quantity upon no input of the first signal to the controller (2) Identify, based on the second signal transmitted from the physical-quantity transmission terminal, the content of the failure upon the first signal being input to the controller This configuration enables the controller to perform both (1) Detection of the physical quantity based on the pulse signal from the physical-quantity transmission terminal upon no failures having occurred (2) Identification of the content of the occurred failure based on the second signal transmitted from the common physical-quantity transmission terminal This therefore enables the microcomputer to recognize the content of the occurred failure while maintaining the number of terminals.

BRIEF DESCRIPTION OF THE DRAWINGS

Other aspects of the present disclosure will become apparent from the following description of embodiments with reference to the accompanying drawings in which:

FIG. 13 is a flowchart schematically illustrating a drive control and failure identification routine carried out by a microprocessor according to the first embodiment;

FIG. 14 is a table illustrating how the overheating failure of a drive IC and the overcurrent failure are informed according to a modification of the first embodiment;

DETAILED DESCRIPTION OF EMBODIMENT

Figure 1:
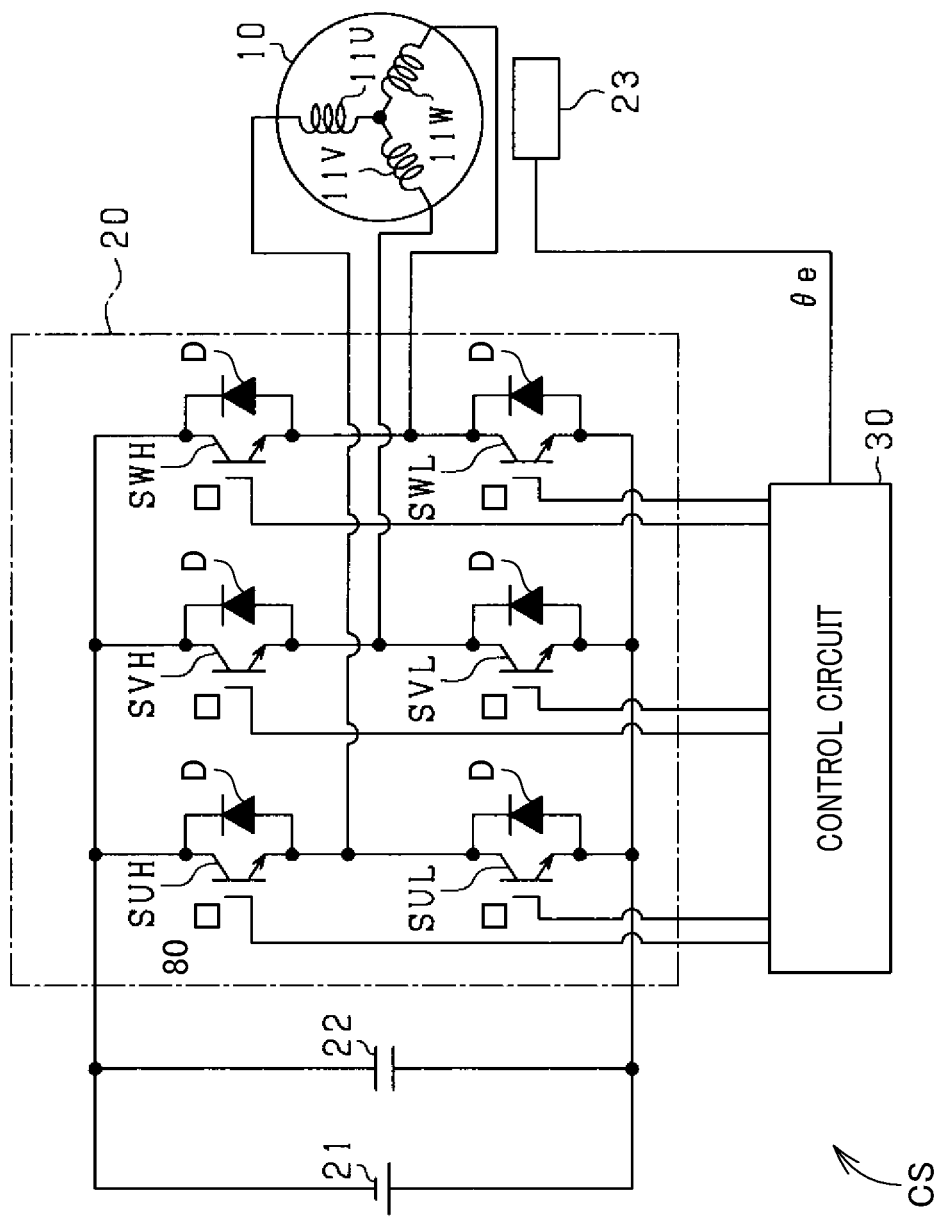
FIG. 1 is a circuit diagram schematically illustrating an example of the overall structure of a control system for a rotary electric machine according to the first embodiment of the present disclosure.

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 14. A drive device according to the present embodiment is embodied as a component of a control system CS for controlling a rotary electric machine 10.

Referring to FIG. 1, the control system CS includes a direct-current (DC) power source 21, an inverter 20, and a control circuit 30.

The rotary electric machine 10 is installed in a mobile vehicle, such as a hybrid vehicle or an electric vehicle, which serves as, for example, a main engine of the mobile vehicle. The rotary electric machine 10 is electrically connected to the DC power source 21 via the inverter 20. The first embodiment uses a permanent magnet synchronous three-phase motor-generator as the rotary electric machine 10.

In particular, the rotary electric machine 10 includes a rotor having permanent magnets, and a stator having a stator core and three-phase stator coils 11U, 11V, and 11W. The rotor is mechanically connected to driving wheels of the mobile vehicle. In particular, the rotary electric machine 10 is capable of rotating the rotor having the permanent magnets based on magnetic interactions between the permanent magnets of the rotor and a rotating magnetic field generated by the three-phase stator coils 11U, 11V, and 11W, thus rotating the driving wheels of the mobile vehicle. Each of the three-phase stator coils 31 has opposing first and second ends. The stator can be configured such that each of the three-phase stator coils 11U, 11V, and 11W is wound in and around the stator core in concentrated or distributed configuration.

The control system CS also includes a smoothing capacitor 22 connected in parallel to the DC power source 21.

The DC power source 21 has a terminal voltage of several hundreds of volts (V), and the smoothing capacitor 22 is configured to smooth the terminal voltage of the DC power source 21, so that the smoothed voltage is input to the inverter 20 as an inverter input voltage.

The inverter 20 includes three (UVW)-phase series-connected switch members for the respective three-phase of the rotary electric machine 10. The U-phase series-connected switch member is comprised of an upper-arm U-phase switch SUH and a lower-arm U-phase switch SUL connected in series to each other. The V-phase series-connected switch member is comprised of an upper-arm V-phase switch SVH and a lower-arm V-phase switch SVL connected in series to each other. The W-phase series-connected switch member is comprised of an upper-arm W-phase switch SWH and a lower-arm W-phase switch SWL connected in series to each other.

The connection point between the upper- and lower-arm switches SUH and SUL is connected to the first end of the U-phase stator coil 11U. Similarly, the connection point between the upper- and lower-arm switches SVH and SVL is connected to the first end of the V-phase stator coil 11V, and the connection point between the upper- and lower-arm switches SWH and SWL is connected to the first end of the W-phase stator coil 11W. The second ends of the U-, V-, and W-phase coils 11U, 11V, and 11W are connected to a common junction, i.e. a neutral point, in, for example, a star-configuration such that three-phase windings coils 11U, 11V, and 11W have a phase difference of 120 electrical degrees from each other.

The inverter 20 includes freewheel diodes or flyback diodes D connected in anti-parallel to the respective switches.

The first embodiment uses voltage-controlled semiconductor switches as the respective switches. Specifically, the first embodiment uses IGBTs as the respective switches. The collector of each upper-arm switch SUH, SVH, and SWH, which serves as a high-side terminal, is connected to a positive terminal of the DC power source 21, and the emitter of each lower-arm switch SUL, SVL, and SWL, which serves as a low-side terminal, is connected to a negative terminal of the DC power source 21.

The control system CS also includes a rotational angle sensor 23. The rotational angle sensor 23, which is comprised of, for example, a resolver, is disposed to be adjacent to, for example, the rotor of the rotary electric machine 10. The rotational angle sensor 23 is configured to measure, i.e. monitor, a rotational electrical angle θe of the rotor of the rotary electric machine 10, and output the rotational electrical angle θe to the control circuit 30.

The control system CS further includes temperature sensors 80 provided for the respective switches SUH, SUL, SVH, SVL, SWH, and SWL. Each temperature sensor 80 is configured to measure a temperature of the corresponding switch, and output a measurement signal indicative of the measured temperature to the control circuit 30.

The control circuit 30 is connected to a control terminal of each switch SUH, SUL, SVH, SVL, SWH, and SWL, and configured to alternately turn on the upper- and lower-arm switches for each phase to thereby control a controlled variable, such as torque, of the rotary electric machine 10 to a commanded value or a requested value.

Figure 2:
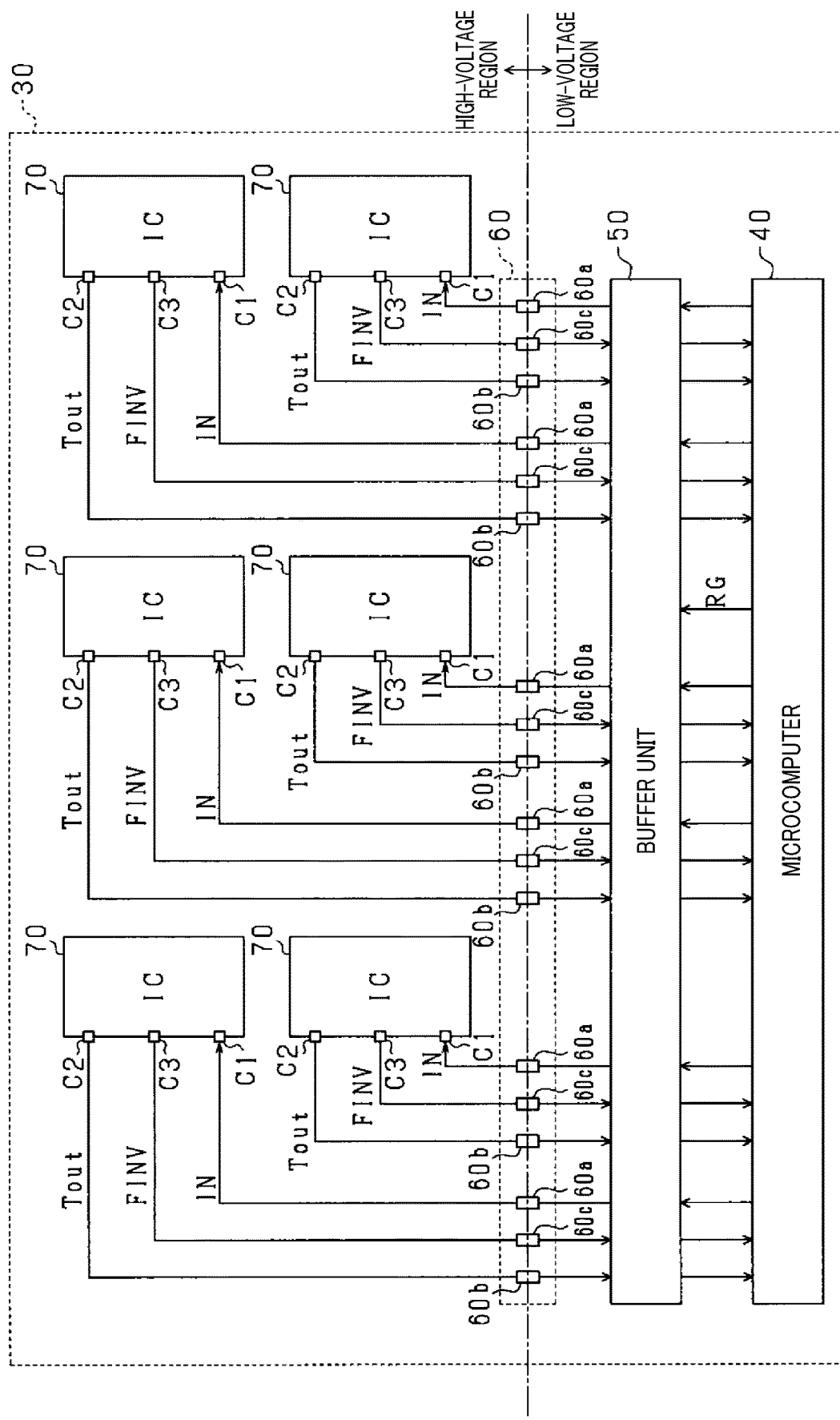
FIG. 2 is a circuit diagram schematically illustrating an example of the structure of a control circuit illustrated in FIG. 1.
Figure 3:
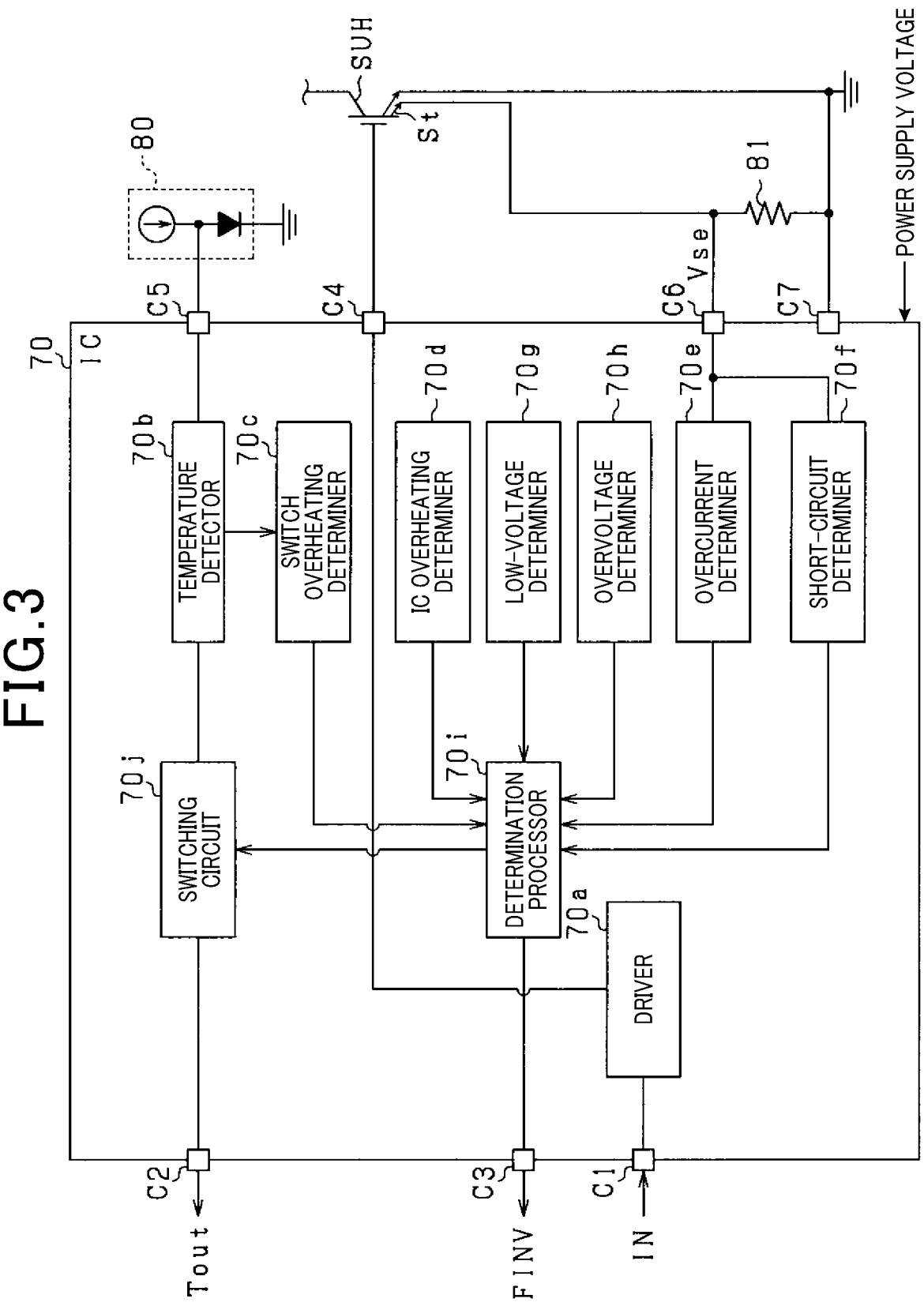
FIG. 3 is a block diagram schematically illustrating a drive IC and its peripheral units according to the first embodiment.

Next, the following describes in detail the control circuit 30 with reference to FIGS. 1 to 3.

The control circuit 30 includes a microcomputer 40, a buffer unit 50, an isolation communication unit 60, and drive integration circuits (IC) 70. The drive ICs 70 are individually provided for the respective switches SUH, SUL, SVH, SVL, SWH, and SWL.

The drive ICs 70 for the respective switches SUH, SUL, SVH, SVL, SWH, and SWL basically have a common structure. For this reason, the following describes the structure of the drive IC 70 for the U-phase upper-arm switch SUH as a typical example.

Referring to FIG. 2, the control circuit 30 has a low-voltage region serving as a first circuit region, and a high-voltage region serving as a second circuit region. The microcomputer 40 and the buffer unit 50 are mounted to the low-voltage region, and the drive ICs 70 and the switches SUH, SUL, SVH, SVL, SWH, and SWL are mounted to the high-voltage region.

The drive IC 70 has a first terminal C1, a second terminal C2, a third terminal C3 (see FIG. 2), a fourth terminal C4, a fifth terminal C5, a sixth terminal C6, and a seventh terminal C7 (see FIG. 3). To the drive IC 70, a predetermined power supply voltage is supplied, so that the drive IC 70 operates based on the power supply voltage.

The isolation communication unit 60 is capable of electrically isolating the components mounted to the high-voltage region and the components mounted to the low-voltage region from each other while enabling communications between the components mounted to the high-voltage region and the components mounted to the low-voltage region.

For example, the isolation communication unit 60 includes plural sets of, specifically, first to sixth sets of, first, second, and third transmitters 60a, 60b, and 60c. The first set of the first, second, and third transmitters 60a, 60b, and 60c is provided for the drive IC 70 for the U-phase upper-arm switch SUH, and the second set of the first, second, and third transmitters 60a, 60b, and 60c is provided for the drive IC 70 for the U-phase lower-arm switch SUL. Similarly, the third set of the first, second, and third transmitters 60a, 60b, and 60c is provided for the drive IC 70 for the V-phase upper-arm switch SVH, and the fourth set of the first, second, and third transmitters 60a, 60b, and 60c is provided for the drive IC 70 for the V-phase lower-arm switch SVL. Additionally, the fifth set of the first, second, and third transmitters 60a, 60b, and 60c is provided for the drive IC 70 for the W-phase upper-arm switch SWH, and the sixth set of the first, second, and third transmitters 60a, 60b, and 60c is provided for the drive IC 70 for the W-phase lower-arm switch SWL.

The first to third transmitters 60a to 60c for the drive IC 70 for the U-phase upper-arm switch SUH provide electrically isolated signal paths, i.e. signal routes, between the drive IC 70 and the microcomputer 40. For example, each of the first to third transmitters 60a to 60c of each set is comprised of a photocoupler or a magnetic coupler, which is configured to enable communications between the drive IC 70 for the U-phase upper-arm switch SUH and the microcomputer 40 while establishing electrical isolation therebetween.

The microcomputer 40 is comprised of, for example, a CPU 40a, a memory 40b, and peripheral circuits 40c communicably connected to one another. The microcomputer 40 serves as, for example, a controller configured to generate, based on the rotational electrical angle θe measured by the rotational angle sensor 23, drive signals IN for the respective switches SUH, SUL, SVH, SVL, SWH, and SWL for adjusting the controlled variable of the rotary electric machine 10 to the requested value. As described above, the microcomputer 40 of the first embodiment adjusts the torque of the rotary electric machine 10 to requested torque Trq*. Each of the drive signals IN is one of an on command for instructing the corresponding switch to be turned on, and an off command for instructing the corresponding switch to be turned off.

In particular, the microcomputer 40 generates the drive signals IN for the upper- and lower-arm switches of each phase such that the upper- and lower-arm switches are complementarily, i.e. alternatively, turned on. The drive signals IN generated by the microcomputer 40 are transmitted through the buffer unit 50 and the respective first transmitters 60a to the first terminals C1 of the respective drive ICs 70. The first terminal C1 of the first embodiment corresponds to, for example, a drive signal input terminal.

Each drive IC 70 includes a driver 70a, a temperature detector 70b, a switch overheating determiner 70c, an IC overheating determiner 70d, and an overcurrent determiner 70e. Each drive IC 70 also includes a short-circuit determiner 70f, a low voltage determiner 70g, an overvoltage determiner 70h, a determining processor 70i, and a switching circuit 70j. Additionally, sense resistors 81 are for example externally provided for the respective drive ICs 70.

As described above, the following describes the structure of the drive IC 70 for the U-phase upper-arm switch SUH as a typical example.

The driver 70a receives the drive signal IN for the U-phase upper-arm switch SUH input from the first terminal C1.

The driver 70a performs a charging task upon determining that the input drive signal IN is the on command; the charging task supplies a charging current to the control terminal, i.e. the gate, of the switch SUH via the fourth terminal C4. This charging task causes a gate voltage of the switch SUH to be equal to or higher than a threshold voltage Vth, resulting in the switch SUH being turned on.

In contrast, the driver 70a performs a discharging task upon determining that the input drive signal IN is the off command; the discharging task discharges a discharging current from the control terminal, i.e. the gate, of the switch SUH. This discharging task causes the gate voltage of the switch SUH to be lower than the threshold voltage Vth, resulting in the switch SUH being turned off.

As described above, the temperature sensor 80 for the switch SUH is configured to measure the temperature, which will be referred to as TD, of the switch SUH whose control terminal is connected to the fourth terminal C4, and output the measurement signal indicative of the measured temperature to the temperature detector 70b via the fifth terminal C5.

The temperature detector 70b includes a unit 70b1 that receives the measurement signal, and a unit 70b2 that performs a pulse-width modulation (PWM) of the received measurement signal to thereby generate a cyclic pulse signal having a controlled duty factor, i.e. duty or duty ratio, Duty that correlates with the temperature TD of the switch SUH.

Figure 4:
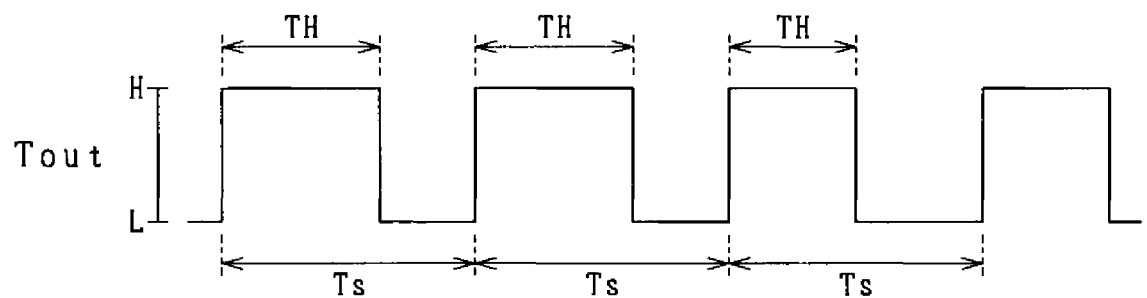
FIG. 4 is a diagram schematically illustrating an example of a signal transmitted from a second terminal when no failures associated with a switch have occurred.

Referring to FIG. 4, the duty factor Duty of the cyclic pulse signal represents a controllable ratio, i.e. percentage, of a logical high-level duration TH of a pulse to a predetermined cycle Ts of the cyclic pulse signal. Note that the logical high level of the cyclic pulse signal will be referred to with a reference character H, and the logical low level of the cyclic pulse signal will be referred to with a reference character L.

The cycle Ts of the cyclic pulse signal will be referred to as a standard cycle Ts.

Figure 5:
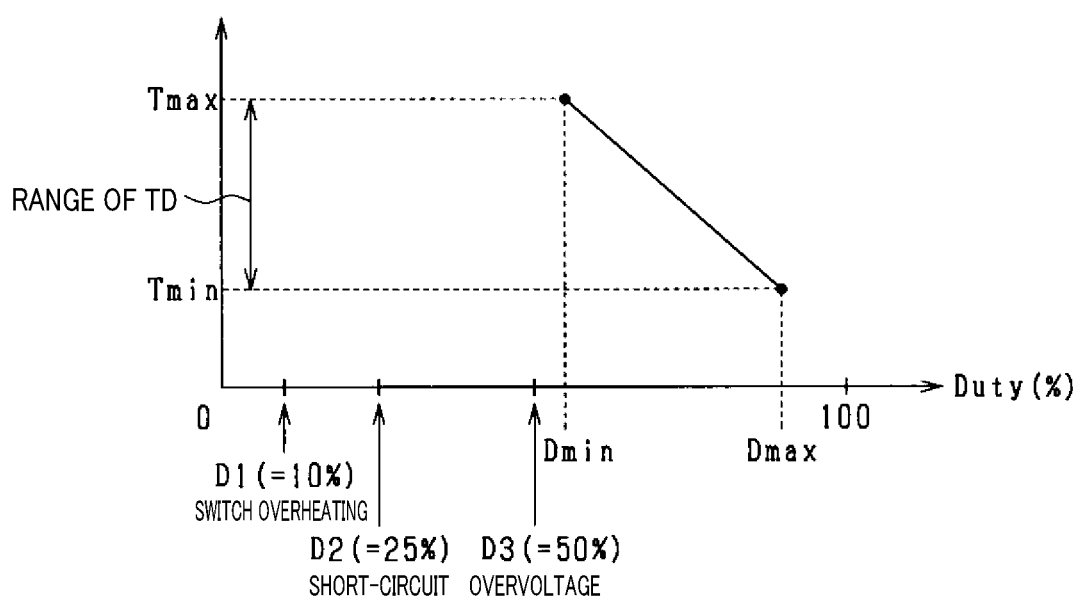
FIG. 5 is a graph schematically illustrating an example of a relationship between a duty factor of a pulse signal output from a temperature detector and a temperature of a switch according to the first embodiment.

The duty factor Duty of the cyclic pulse signal for the switch SUH has a continuous relationship with the temperature TD of the switch SUH within a predetermined temperature detection range defined from a predetermined minimum value Tmin to a predetermined maximum value Tmax inclusive (see FIG. 5).

Specifically, as illustrated in FIG. 5, the maximum value Tmax of the temperature detection range corresponds to a minimum duty factor Dmin of the duty factor Duty, and the minimum value Tmin of the temperature detection range corresponds to a maximum duty factor Dmax of the duty factor Duty. That is, the temperature detection range corresponds to a duty factor range between the minimum duty factor Dmin and the maximum duty factor Dmax.

The temperature detector 70b outputs the cyclic pulse signal from the second terminal C2 via the switching circuit 70j. An output signal of the second terminal C2, which will be referred to as an output signal Tout, is input to the microcomputer 40 via the second transmitter 60b and the buffer unit 50. Note that the second terminal C2 corresponds to, for example, a physical quantity transmission terminal, and the unit 70b1 of the temperature detector 70b serves as, for example, an obtainer, and the unit 70b2 of the temperature detector 70b serves as, for example, a modulator.

The switch overheating determiner 70c receives the measurement signal of the temperature sensor 80 sent from the temperature detector 70b to thereby recognize the temperature of the switch SUH. Then, the switch overheating determiner 70c determines whether the temperature of the switch SUH is higher than a predetermined first overheating threshold. The switch overheating determiner 70c determines that there is an overheating failure in the switch SUH upon determining that the temperature of the switch SUH is higher than the first overheating threshold. The switch overheating determiner 70c outputs a determination result indicative of whether there is an overheating failure in the switch SUH to the determination processor 70i.

The IC overheating determiner 70d has a function of detecting the temperature of the corresponding drive IC 70, and determines whether the temperature of the drive IC 70 is higher than a predetermined second overheating threshold. The IC overheating determiner 70d determines that there is an overheating failure in the drive IC 70 upon determining that the temperature of the drive IC 70 is higher than the second overheating threshold. The IC overheating determiner 70d outputs a determination result indicative of whether there is an overheating failure in the drive IC 70 to the determination processor 70i.

Each switch of the inverter 20 has a sense terminal St for outputting a minute current, i.e. a sense current, associated with a current, i.e. a collector current, flowing through a conductive path between an input terminal and an output terminal of the switch, i.e. between the collector and the emitter of the switch. The sense terminal St is connected to a first end of the sense resistor 81, and a second end, opposing the first end, of the sense resistor 81 is connected to the emitter of the switch via a common signal ground.

When the collector current flows through the conductive path of each switch, the sense current correlating with the collector current flows through the sense resistor 81, so that a voltage drop across the sense resistor 81 occurs. Thus, a voltage at the first end of the sense resistor 81, which will be referred to as a sense voltage Vse, serves as, for example, an electric state parameter correlating with the magnitude of the collector current flowing through the switch. That is, the level of the sense voltage Vse serves as, for example, a function of, i.e. correlates with, the magnitude of the collector current flowing through the switch.

The sixth terminal C6 of the drive IC 70 is connected to the first end of the sense resistor 81, and the emitter of the switch SUH and the seventh terminal C7 of the drive IC 70 are connected to the second end of the sense resistor 82 via the common signal ground. That is, the drive IC 70 operates based on the potential of the seventh terminal C7.

The overcurrent determiner 70e receives the sense voltage Vse via the sixth terminal C6, and determines whether the sense voltage Vse is higher than a predetermined overcurrent threshold. The overcurrent determiner 70e determines that there is an overcurrent failure upon determining that the sense voltage Vse is higher than the overcurrent threshold; the overcurrent failure represents that an overcurrent is flowing through the switch SUH. The overcurrent determiner 70e outputs a determination result indicative of whether there is an overcurrent failure to the determination processor 70i.

The short-circuit determiner 70f receives the sense voltage Vse via the sixth terminal C6, and determines whether the sense voltage Vse is higher than a predetermined short-circuit threshold. The short-circuit determiner 70f determines that there is a short-circuit failure upon determining that the sense voltage Vse is higher than the short-circuit threshold. The short-circuit failure represents that upper- and lower-arm switches for the same phase are simultaneously on so that they are short-circuited, resulting in a short-circuit current flowing through the corresponding upper- and lower-arm switches. The short-circuit determiner 70f outputs a determination result indicative of whether there is a short-circuit failure in the drive IC 70 to the determination processor 70i.

The low voltage determiner 70g has a function of detecting the power supply voltage supplied to the drive IC 70, and determines whether the power supply voltage is lower than a predetermined low-voltage threshold. The low voltage determiner 70g determines that there is a low voltage failure upon determining that the power supply voltage is lower than the low-voltage threshold. The low voltage determiner 70g outputs a determination result indicative of whether there is a low-voltage failure to the determination processor 70i.

The overvoltage determiner 70h has a peak-hold function of sampling a peak of an emitter-collector voltage Vce of the switch SUH, and holding the sampled peak. For example, the overvoltage determiner 70h samples, as a peak of the emitter-collector voltage Vce, the magnitude of a surge occurring across the emitter and source of the switch SUH when the switch SUH is switched from an on state to an off state. Then, the overvoltage determiner 70h determines whether the sampled peak is higher than a predetermined overvoltage threshold. The overvoltage determiner 70f determines that there is an overvoltage failure upon determining that the sampled peak is higher than the overheating threshold. The overvoltage determiner 70h outputs a determination result indicative of whether there is an overvoltage failure to the determination processor 70i.

Note that at least one of the overheating failure of a switch, the overheating failure of the drive IC 70 for the switch, the overcurrent failure, the short-circuit failure, the low-voltage failure, and the overvoltage failure corresponds to, for example, a failure associated with the switch.

The determination processor 70i receives the determination results sent from the respective determiners 70c to 70h. Then, the determination processor 70i determines whether at least one of the determination results represents the occurrence of a corresponding failure.

Upon determining that none of the determination results represents the occurrence of a corresponding failure, the determination processor 70i transmits, to the microcomputer 40, a failure signal FINV having a logical low level from the third terminal C3 that serves as, for example, a failure transmission terminal.

Otherwise, upon determining that at least one of the determination results represents the occurrence of a corresponding failure, the determination processor 70i transmits, to the microcomputer 40, the failure signal FINV having a logical high level from the third terminal C3.

The failure signal FINV is input to the microcomputer 40 via the third transmitter 60c and the buffer unit 50. The determination processor 70i of the first embodiment serves as, for example, a failure determiner and a failure signal transmitter.

The buffer unit 50 switches the drive signal IN for each switch, which has the on command, input thereto from the microcomputer 40 to the off command or maintains the drive signal IN for each switch, which has the off command, to be as the off command upon determining that the failure signal FINV input thereto from the third terminal C3 of at least one drive IC 70 has the logical high level. This causes all the switches SUH, SUL, SVH, SVL, SWH, and SWL to be forcibly turned off or maintained in the off state.

Otherwise, even upon determining that the failure signal FINV input thereto from the third terminal C3 of at least one drive IC 70 has the logical high level, the buffer unit 50 transmits the drive signal IN for each switch to the first transmitter 60a for the corresponding IC 70 without switching it from the on command to the off command while a permission signal RG is being input thereto from the microcomputer 40. The permission signal RG is input from the microcomputer 40 to the buffer unit 50 when the microcomputer 40 determines that on-off switching operations of each switch of the inverter 20 are required for safely pulling the mobile vehicle over in a limp-home mode.

Next, the following describes a failure determination routine carried out by the determination processor 70i of each drive IC 70. The determination processor 70i of each drive IC 70 is programmed to perform the failure determination routine every predetermined control period.

When starting the failure determination routine, the determination processor 70i determines whether none of the determination results transmitted from the respective determiners 70c to 70h represents the occurrence of a corresponding failure in step S10. That is, the determination processor 70i determines whether none of the determiners 70c to 70h has determined the occurrence of a corresponding failure in step S10.

Upon determining that none of the determiners 70c to 70h has determined the occurrence of a corresponding failure (YES in step S10), the determination processor 70i transmits the failure signal FINV with the logical low level from the third terminal C3 to the microcomputer 40 in step S11. In step S11, the determination processor 70i also transmits the cyclic pulse signal including the temperature TD of the corresponding switch to the microcomputer 40 via the switching circuit 70j as the output signal Tout.

Otherwise, upon determining that one of the determiners 70c to 70h has determined the occurrence of a corresponding failure (NO in step S10), the determination processor 70i controls the switching circuit 70j to thereby disable the switching circuit 70j from outputting the cyclic pulse signal as the output signal Tout in step S12. In step S12, the determination processor 70i also switches the logical level of the failure signal FINV from the logical low level to the logical high level.

Following the operation in step S12, the determination processor 70i determines whether the occurred failure shows an overheating failure of the corresponding switch in step S13. Upon determining that the occurred failure shows an overheating failure of the corresponding switch (YES in step S13), the determination processor 70i causes the switching circuit 70j to output the cyclic pulse signal whose duty factor Duty has a first value D1 of 10% (see FIG. 7) from the second terminal C2 to the microcomputer 40 as the output signal Tout in step S14. That is, the first value D1 of 10% of the duty factor Duty is associated with information indicative of the occurrence of an overheating failure of the corresponding switch, and is set outside the duty factor range (see FIG. 5).

Otherwise, upon determining that the occurred failure does not show the occurrence of an overheating failure of the corresponding switch (NO in step S13), the determination processor 70i determines whether the occurred failure shows an overheating failure in the corresponding drive IC 70 in step S15. Upon it being determined that the occurred failure shows an overheating failure in the corresponding drive IC 70 (YES in step S15), the failure determination routine proceeds to step S16.

In step S16, the determination processor 70i causes the switching circuit 70j to output the output signal Tout, which is comprised of an on-off pulse header H1 having a predetermined length Tf and the cyclic pulse signal whose duty factor Duty is 50% (see FIG. 8) subsequent to the on-off pulse header H1, from the second terminal C2 to the microcomputer 40. That is, the set of the on-off pulse header H1 and the cyclic pulse signal with the duty factor Duty of 50% is associated with information indicative of the occurrence of an overheating failure in the corresponding drive IC 70. Note that the on-off pulse header H1 has an on pulse and an off pulse within the length Tf that is longer than the standard cycle Ts of the cyclic pulse signal.

Otherwise, upon determining that the occurred failure does not show an overheating failure in the corresponding drive IC 70 (NO in step S15), the determination processor 70i determines whether the occurred failure shows an overcurrent failure in step S17. Upon it being determined that the occurred failure shows an overcurrent failure (YES in step S17), the failure determination routine proceeds to step S18.

In step S18, the determination processor 70i causes the switching circuit 70j to output a modified cyclic pulse signal whose cycle Tc is half the standard cycle Ts of the pulse signal output from the temperature detector 70b (see FIG. 9) from the second terminal C2 to the microcomputer 40 as the output signal Tout. That is, the cycle Tc of the modified cyclic pulse signal, which is half the standard cycle Ts of the pulse signal output from the temperature detector 70b, is associated with information indicative of the occurrence of an overcurrent failure. In particular, the determination processor 70i causes the switching circuit 70j to output the modified cyclic pulse signal whose duty factor DtyC expressed by the percentage of the logical high duration TH of a pulse to the cycle Tc is associated with a value of the sense voltage Vse at the timing when the determination in step S10 is affirmative.

Figure 9:
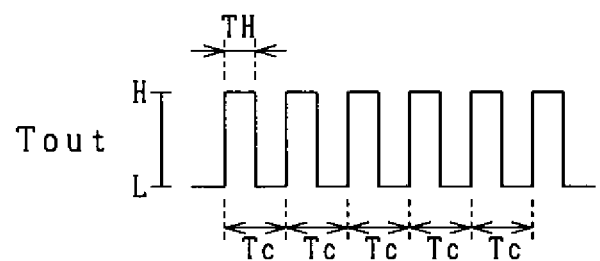
FIG. 9 is a diagram schematically illustrating how an overcurrent failure is informed according to the first embodiment.
Figure 10:
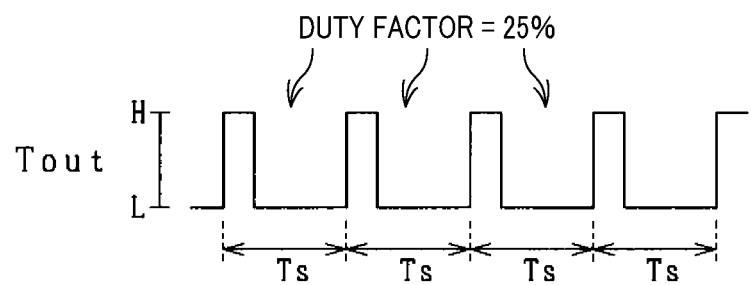
FIG. 10 is a diagram schematically illustrating how a short-circuit failure is informed according to the first embodiment.
Figure 11:
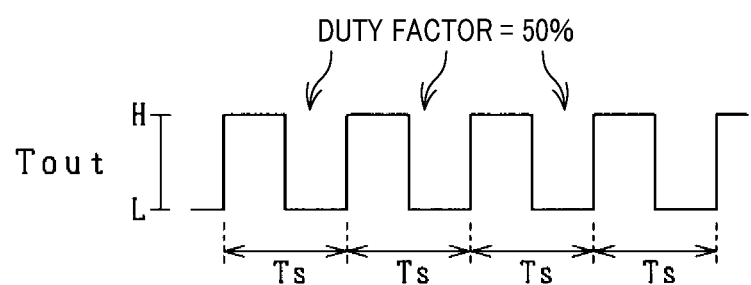
FIG. 11 is a diagram schematically illustrating how an overvoltage failure is informed according to the first embodiment.
Figure 12:
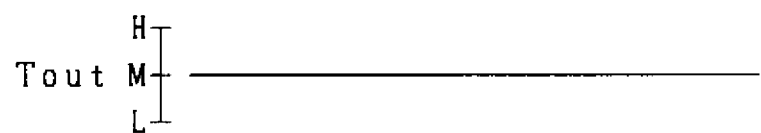
FIG. 12 is a diagram schematically illustrating how a low-voltage failure is informed according to the first embodiment.

Note that FIG. 9 illustrates that the cycle Tc of the modified cyclic pules signal, which will also be referred to as a modified cycle Tc, is half the standard cycle Ts of the cyclic pulse signal output from the temperature detector 70b as an example, but can be set to be for example longer than the standard cycle Ts.

Otherwise, upon determining that the occurred failure does not show an overcurrent failure (NO in step S17), the determination processor 70i determines whether the occurred failure shows a short-circuit failure in step S19. Upon it being determined that the occurred failure shows a short-circuit failure (YES in step S19), the failure determination routine proceeds to step S20.

In step S20, the determination processor 70i causes the switching circuit 70j to output the cyclic pulse signal whose duty factor Duty has a second value D2 of 25% (see FIG. 10) from the second terminal C2 to the microcomputer 40 as the output signal Tout. That is, the second value D2 of 25% of the duty factor Duty is associated with information indicative of the occurrence of a short-circuit failure, and is set outside the duty factor range (see FIG. 5).

Otherwise, upon determining that the occurred failure does not show a short-circuit failure (NO in step S19), the determination processor 70i determines whether the occurred failure shows an overvoltage failure in step S21. Upon it being determined that the occurred failure shows an overvoltage failure (YES in step S21), the failure determination routine proceeds to step S22.

In step S22, the determination processor 70i causes the switching circuit 70j to output the cyclic pulse signal whose duty factor Duty has a third value D3 of 50% (see FIG. 11) from the second terminal C2 to the microcomputer 40 as the output signal Tout. That is, the third value D3 of 50% of the duty factor Duty is associated with information indicative of the occurrence of an overvoltage failure, and is set outside the duty factor range (see FIG. 5).

Note that the duty factor Duty of the cyclic pulse signal indicative of the information about an overheating failure of the drive IC 70, which is 50%, is identical to the duty factor Duty of the cyclic pulse signal indicative of the information about an overvoltage failure, which is 50%. However, the on-off pulse header H1 included in the output signal Tout, which represents the occurrence of an overheating failure of the drive IC 70, enables the occurrence of an overheating failure of the drive IC 70 and the occurrence of an overvoltage failure to be distinguished.

Otherwise, upon determining that the occurred failure does not show an overvoltage (NO in step S21), the determination processor 70i determines that the occurred failure shows a low-voltage failure. Then, the failure determination routine proceeds to step S23.

In step S23, the determination processor 70i causes the switching circuit 70j to output a signal having a predetermined fixed level M within the range from the logical high level (H) to the logical low level (L) (see FIG. 12) from the second terminal C2 to the microcomputer 40 as the output signal Tout. That is, the signal having the fixed logical level M is associated with information indicative of the occurrence of a low-voltage failure.

When completing the operation in step S11, S14, S16, S18, S20, S22, or S23, the determination processor 70i terminates the failure determination routine.

Note that at least one of the determiners 70c, 70d, 70e, 70f, 70h, and 70g and a corresponding at least one of the operations in steps S13, S15, S17, S19, S21, or S23 serve as, for example, the failure determiner. In addition, at least one of the operations in steps S14, S16, S18, S20, S22, or S23 serve as, for example, the failure signal transmitter.

Next, the following describes a drive control and failure identification routine, which will be referred to simply as a drive control routine, carried out by the microcomputer 40. The microcomputer 40 is programmed to perform the drive control routine every predetermined control period; this control period can be equal to or different from the control period of the determination processor 70i of each drive IC 70.

When starting the drive control routine, the microcomputer 40 determines whether each of the failure signals FINV sent from all the drive ICs 70 has the logical low level in step S30.

Upon it being determined that each of the failure signals FINV sent from all the drive ICs 70 has the logical low level (YES in step S30), the microcomputer 40 determines that each of the determiners 70c to 70h has determined there are no failures associated with the corresponding switch. Then, the drive control routine proceeds to step S31. In step S31, the microcomputer 40 detects the temperature TD of each of the switches SUH, SUL, SVH, SVL, SWH, and SWL in accordance with the duty factor Duty of the corresponding one of the output signals Tout sent from the second terminal C2 of the corresponding one of the drive ICs 70. Next, the microcomputer 40 selects, from the detected temperatures TD of all the switches SUH, SUL, SVH, SVL, SWH, and SWL, the highest one of the detected temperatures as a control temperature TdL. For example, the memory 40b stores information indicative of a relationship between value of the temperature TD and corresponding values of the duty factor Duty illustrated in FIG. 5. This information enables the microcomputer 40 to obtain the temperature TD of each switch based on the duty factor Duty of the corresponding one of the output signals Tout.

Next, the microcomputer 40 generates, based on the control temperature TL, the drive signals IN for the respective switches SUH, SUL, SVH, SVL, SWH, and SWL in step S32. In particular, the microcomputer 40 adjusts the drive signals IN to thereby limit the torque of the rotary electric machine 10 upon determining that the control temperature Td is higher than a predetermined threshold temperature Tdth.

In step S32, the microcomputer 40 calculates a correction coefficient K within the range from 0 to 1 inclusive based on a result of comparison between the control temperature TdL and the threshold temperature Tdth first. Specifically, the microcomputer 40 sets the correction coefficient K to 1 upon the control temperature TL being equal to or lower than the threshold temperature Tdth. In addition, the microcomputer 40 sets the correction coefficient K to be a lower value less than 1 as the control temperature TdL changes to be a higher value upon the control temperature TL being higher than the threshold temperature Tdth. Then, the microcomputer 40 multiplies the request torque Trq* by the calculated correction coefficient K, thus calculating corrected request torque Trf. On the basis of the calculated corrected request torque Trf, the microcomputer 40 generates the drive signals IN for the respective switches SUH, SUL, SVH, SVL, SWH, and SWL.

On the other hand, upon it being determined that one of the failure signals FINV sent from all the drive ICs 70 has the logical high level (NO in step S30), the microcomputer 40 determines that a failure associated with one of the drive ICs 70 corresponding to the logical high-level failure signal FINV has occurred in step S30. Hereinafter, one of the drive ICs 70 corresponding to the logical high-level failure signal FINV will be referred to as a failure-related drive IC 70.

Following the determination in step S30, the microcomputer 40 identifies, based on the output signal Tout sent from the second terminal C2 of the failure-related drive IC 70, a content of the occurred failure in step S33.

Next, the following describes how the microcomputer 40 identifies the content of the occurred failure, i.e. the information about the occurred failure, in accordance with the output signal Tout sent from the second terminal C2 of the failure-related drive IC 70 in step S33.

In step S33, the microcomputer 40 performs a first determination of whether the duty factor Duty of the cyclic pulse signal included in the output signal Tout sent from the second terminal C2 of the failure-related drive IC 70 is set to the first value D1 of 10%. Then, the microcomputer 40 identifies that the occurred failure is an overheating failure of the switch corresponding to the failure-related drive IC 70 upon determining that the duty factor Duty is set to the first value D1 of 10% in step S33.

Otherwise, in step S33, the microcomputer 40 performs a second determination of whether the output signal Tout sent from the second terminal C2 of the failure-related drive IC 70 is comprised of the on-off pulse header H1 and the cyclic pulse signal, whose duty factor Duty is 50%, subsequent to the on-off pulse header H1. Then, the microcomputer 40 identifies that the occurred failure is an overheating failure in the failure-related drive IC 70 upon determining that the output signal Tout is comprised of the on-off pulse header H1 and the cyclic pulse signal, whose duty factor Duty is 50%, subsequent to the on-off pulse header H1 in step S33.

Otherwise, in step S33, the microcomputer 40 performs a third determination that (1) Calculates the cycle of the cyclic pulse signal included in the output signal Tout sent from the second terminal C2 of the failure-related drive IC 70 in accordance with intervals of rising edges of adjacent pulses of the cyclic pulse signal (2) Determines whether the calculated cycle of the cyclic pulse signal matches with the modified cycle Tc set forth above The microcomputer 40 identifies that the occurred failure is an overcurrent failure upon determining that the calculated cycle of the cyclic pulse signal matches with the modified cycle Tc set forth above in step S33.

Otherwise, in step S33, the microcomputer 40 performs a fourth determination of whether the duty factor Duty of the cyclic pulse signal included in the output signal Tout sent from the second terminal C2 of the failure-related drive IC 70 is set to the second value D2 of 25% or the third value D3 of 50%. Then, the microcomputer 40 identifies that the occurred failure is a short-circuit failure upon determining that the duty factor Duty is set to the second value D2 of 25% or an overvoltage failure upon determining that the duty factor Duty is set to the third value D3 of 50% in step S33.

Otherwise, in step S33, the microcomputer 40 performs a fifth determination of whether the output signal Tout sent from the second terminal C2 of the failure-related drive IC 70 has the fixed level M. Then, the microcomputer 40 identifies that the occurred failure is a low-voltage upon determining that the output signal Tout has the fixed level M in step S33.

Note that the microcomputer 40 can perform these first to fifth determinations in a random order, or perform the second determination and fifth determination earlier than the first, third, and fourth determinations, or collectively perform the first and fourth determinations.

Following the operation in step S33, the microcomputer 40 identifies, based on which of the failure signals FINV has the logical high level, failure location information indicative of (1) One of the three phases of the rotary electric machine 10 as a failure-related phase (2) One of the upper- and lower-arms of the switches as a failure-related arm phase in step S34

That is, the third transmitters 60c, which are individually provided for all the respective drive ICs 70 for individually transmitting the failure signals FINV therefrom, enable which of the drive ICs 70 is associated with the occurred failure to be identified.

Subsequently, the microcomputer 40 determines whether the identified failure is an overcurrent failure in step S35. Upon determining that the identified failure is an overcurrent failure (YES in step S35), the microcomputer 40 calculates, based on the duty factor DtyC of the cyclic pulse signal included in the output signal Tout, a value of the sense voltage Vse at the timing when the determination in step S10 is affirmative, i.e. when the overcurrent failure was determined to occur in step S36. This enables the microcomputer 40 to obtain a value of the collector current flowing through the corresponding switch at the occurrence of the overcurrent failure.

Upon completing the operation in step S36 or performing negative determination in step S35, the microcomputer 40 performs a prevention task that prevents the output signal Tout sent from the second terminal C2 of the failure-related drive IC 70 from being used to generate the corresponding drive signal IN in step S37. That is, change of the logical level of the failure signal FINV sent from a drive IC 70 to the logical high level results in the output signal Tout including no information about the temperature TD of the corresponding switch. If such information were used to generate the corresponding drive signal IN, the reliability of the control system CS would deteriorate. For addressing such an issue, the microcomputer 40 is programmed to perform the operation in step S37.

Additionally, in step S37, the microcomputer 40 generates the drive signals IN for the remaining two-phase upper- and lower-arm switches except for the failure-related phase upper- and lower-arm switches in the limp-home mode, and controls, in the limp-home mode, on-off switching operations of the remaining two-phase upper- and lower-arm switches in accordance with the generated drive signals IN. This operation in step S37 enables the mobile vehicle to be pulled over in the limp-home mode.

When completing the operation in step S32 or S37, the microcomputer 40 terminates the drive control routine.

As described above, the first embodiment obtains the following technical effects.

Specifically, the determination processor 70i of each drive IC 70 disables the cyclic pulse signal generated by the temperature detector 70b from being outputted to the microcomputer 40 and switches the logical level of the failure signal FINV from the low level to the high level upon determining that a failure associated with the corresponding switch and/or drive IC 70 has occurred. The microcomputer 40 detects, based on the duty factor Duty of the cyclic pulse signal sent as the output signal Tout from the second terminal C2 of each drive IC 70, the temperature of the corresponding switch upon determining that the logical level of the failure signal FINV sent from the corresponding drive IC 70 is the low level.

Otherwise, the microcomputer 40 recognizes, based on the logical high level of the failure signal FINV sent from, for example, one of the drive ICs 70, that a failure associated with the corresponding switch has occurred. Then, the microcomputer 40 identifies information about or a content of the occurred failure in accordance with the output signal Tout sent from one of the drive ICs 70. That is, each drive IC 70 is configured to transmit, to the microcomputer 40, a signal including the information about a failure, which includes, for example, the content of the occurred failure, via the second terminal C2 upon determining that the failure associated with the corresponding switch has occurred. This configuration enables the microcomputer 40 to identify the content or description of the occurred failure based on the signal while maintaining the number of terminals of each drive IC 70.

Referring to FIG. 5, each drive IC 70 according to the first embodiment is configured such that the first value D1 of the duty factor Duty associated with information indicative of the occurrence of an overheating failure is set outside a duty factor range defined from the maximum duty factor Dmax to the minimum duty factor Dmin inclusive, which corresponds to the temperature detection range from the minimum value Tmin to the maximum value Tmax. Similarly, each drive IC 70 according to the first embodiment is configured such that the second value D2 of the duty factor Duty associated with information indicative of the occurrence of a short-circuit failure, and the third value D3 of the duty factor Duty associated with information indicative of the occurrence of an overvoltage failure are set outside the duty factor range defined from the minimum duty factor Dmin to the maximum duty factor Dmax inclusive.

The above configuration enables the microcomputer 40 to determine whether a relationship between a present value of the duty factor Duty and the logical level of the failure signal FINV is deviated from a predetermined normal relationship between the duty factor Duty and the logical level of the failure signal FINV even if the microcomputer 40 does not recognize the changed logical high level of the failure signal FINV. This prevents the microcomputer 40 from erroneously determining that the duty factor Duty of the cyclic pulse signal of the output signal Tout transmitted from the second terminal C2 of each drive IC 70 shows the temperature TD of the corresponding switch.

Modifications of First Embodiment

The determination processor 70i can be configured to maintain the logical level of the failure signal FINV to the low level while it is determined that the permission signal RG is input to the buffer unit 50 even if a failure has occurred in any one of the determines 70c to 70h.

The determination processor 70i can be configured to cause the switching circuit 70j to output the cyclic pulse signal whose cycle Tc is half the standard cycle Ts of the pulse signal output from the temperature detector 70b (see FIG. 14) upon determining that the occurrence of an overcurrent failure; the cycle Tc having half of the standard cycle Ts is associated with the occurrence of an overcurrent failure. The determination processor 70i can also be configured to cause the switching circuit 70j to output the cyclic pulse signal whose cycle Tc is one-third of the standard cycle Ts of the pulse signal output from the temperature detector 70b (see FIG. 14) upon deter mining that the occurrence of an overheating failure of a drive IC 70; the cycle Tc having one-third of the standard cycle Ts is associated with the occurrence of an overheating failure.

The duty factor Duty of a cyclic pulse signal can represent a controllable ratio, i.e. percentage, of a logical low-level duration of a pulse to the standard cycle Ts of the cyclic pulse signal.

The buffer unit 50 can be configured to invert the logical level of each signal transmitted from one of the microcomputer 40 and each drive IC 70 to the other thereof.

Second Embodiment

Figure 15:
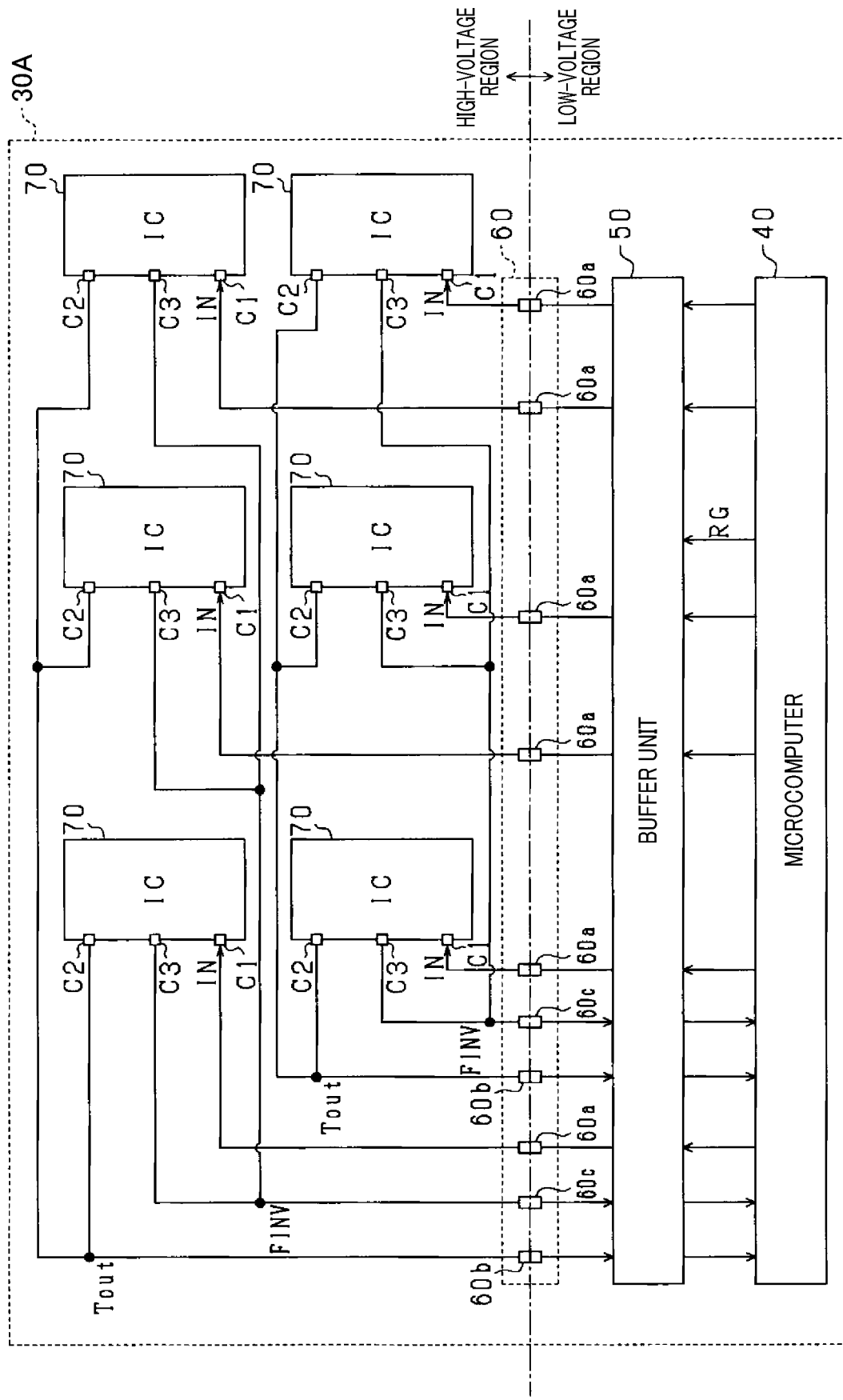
FIG. 15 is a circuit diagram schematically illustrating an example of the structure of a control circuit according the second embodiment of the present disclosure.

The following describes the second embodiment of the present disclosure with reference to FIGS. 15 to 19. FIG. 15 schematically illustrates a control circuit 30A according to the second embodiment. The structures and/or functions of the control circuit 30A according to the second embodiment are different from those of the control circuit 30 according to the first embodiment by the following points. So, the following mainly describes the different points, and omits or simplifies descriptions of like parts between the first and second embodiments, to which identical or like reference characters are assigned, thus eliminating redundant description.

Referring to FIG. 15, the control circuit 30A includes upper-arm drive ICs 70 for driving the respective upper-arm switches SUH, SVH, and SWH, and lower-arm drive ICs 70 for driving the respective lower-arm switches SUL, SVL, and SWL.

The second terminals C2 of the upper-arm drive ICs 70 are commonly connected to a common second transmitter 60b1 shared by the upper-arm drive ICs 70, so that the second terminals C2 of the upper-arm drive ICs 70 are communicable with the microcomputer 40 via the common second transmitter 60b1. Similarly, the second terminals C2 of the lower-arm drive ICs 70 are commonly connected to a common second transmitter 60b2 shared by the lower-arm drive ICs 70, so that the second terminals C2 of the lower-arm drive ICs 70 are communicable with the microcomputer 40 via the common second transmitter 60b2.

In addition, the third terminals C3 of the upper-arm drive ICs 70 are commonly connected to a common third transmitter 60c1 shared by the upper-arm drive ICs 70, so that the third terminals C3 of the upper-arm drive ICs 70 are communicable with the microcomputer 40 via the common third transmitter 60c1. Similarly, the third terminals C3 of the lower-arm drive ICs 70 are commonly connected to a common third transmitter 60c2 shared by the lower-arm drive ICs 70, so that the third terminals C3 of the lower-arm drive ICs 70 are communicable with the microcomputer 40 via the common third transmitter 60c2.

Figure 6:
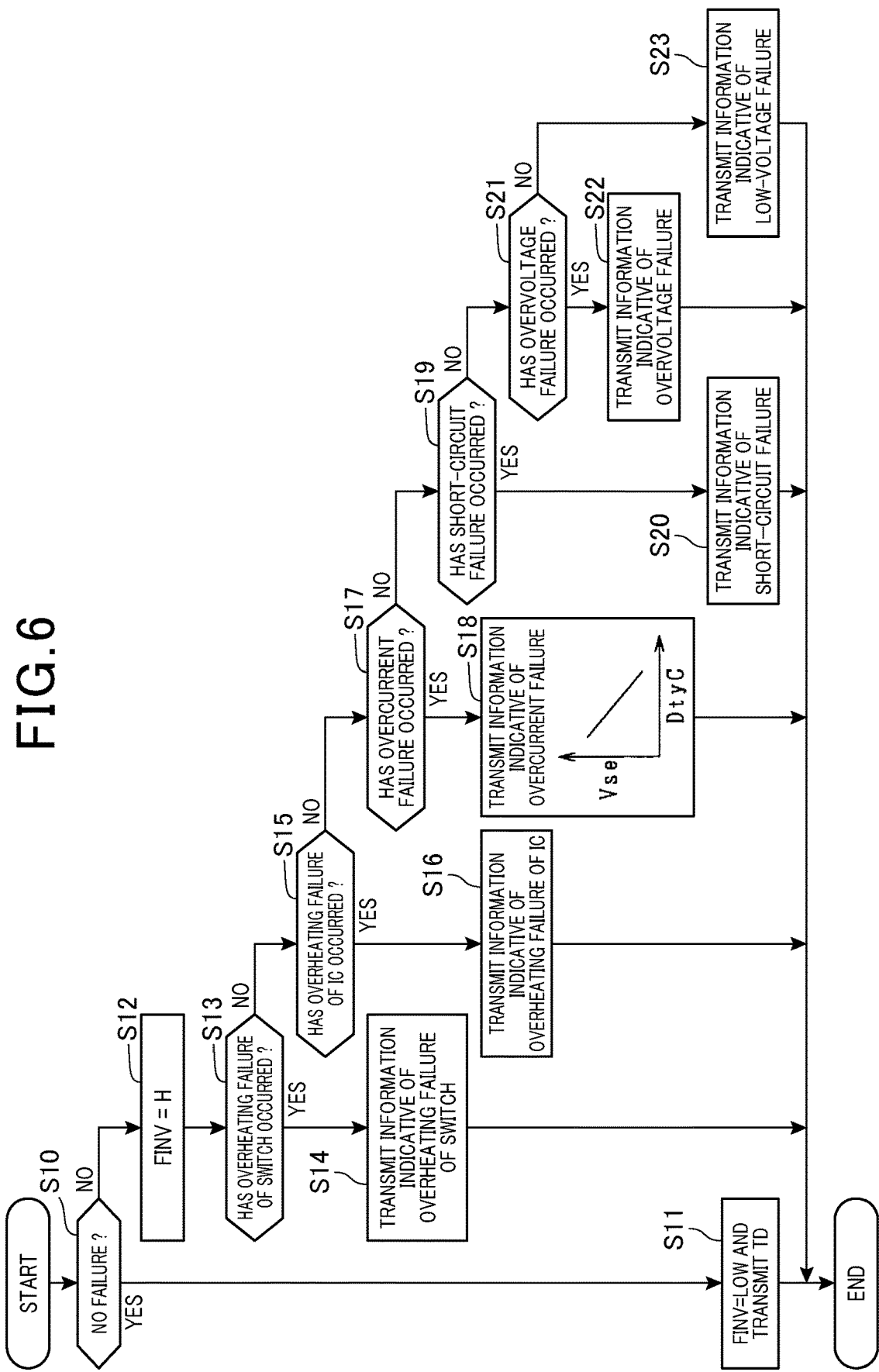
FIG. 6 is a flowchart schematically illustrating a failure determination routine carried out by a determination processor according to the first embodiment.
Figure 7:
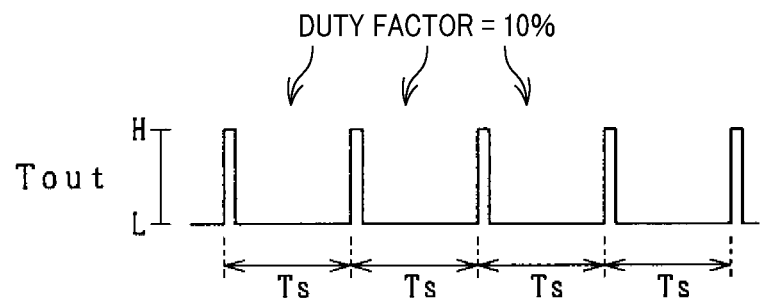
FIG. 7 is a diagram schematically illustrating how an overheating failure of a switch is informed according to the first embodiment.
Figure 8:
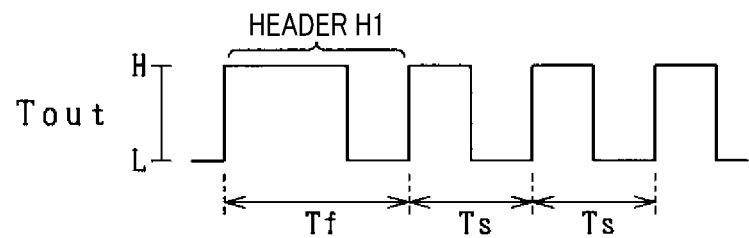
FIG. 8 is a diagram schematically illustrating how an overheating failure of a drive IC is informed according to the first embodiment.

Next, the following describes a failure communication task carried out by the determination processor 70i in each of the operations in steps S14, S16, S18, S20, and S23 of FIG. 6.

Specifically, in each of steps S14, 16, 18, S20, and S23, the determination processor 70i causes the switching circuit 70j to output a modified output signal ToutA, which is comprised of a phase identification header H2 prefixed to the corresponding one of the output signals Tout that are illustrated in respective FIGS. 7 to 12.

Figure 16:
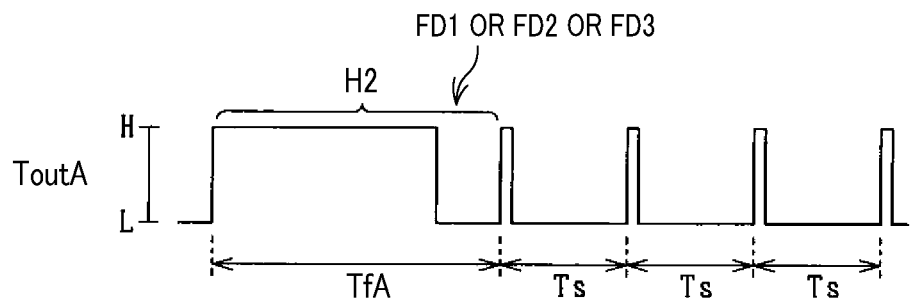
FIG. 16 is a diagram schematically illustrating how the overheating failure of a switch is informed according to the second embodiment.

For example, FIG. 16 schematically illustrates the modified output signal ToutA transmitted from the second terminal C2 of each drive IC 70 upon it being determined that an overheating failure of the corresponding switch has occurred.

Specifically, the phase identification header H2 assigned to the modified output signal ToutA transmitted from the determination processor 70i for a U-phase upper- or lower-arm switch has an on pulse and an off pulse within a predetermined length TfA, and has a predetermined first duty factor FD1 set for the U-phase.

The phase identification header H2 assigned to the modified output signal ToutA transmitted from the determination processor 70i for a V-phase upper- or lower-arm switch has an on pulse and an off pulse within the predetermined length TfA, and has a predetermined second duty factor FD2, which is different from the first duty factor FD1, set for the V-phase.

Additionally, the phase identification header H2 assigned to the modified output signal ToutA transmitted from the determination processor 70i for a W-phase upper- or lower-arm switch has an on pulse and an off pulse within the predetermined length TfA, and has a predetermined third duty factor FD3, which are different from the first and second duty factors FD1 and FD2, set for the W-phase.

That is, any of the duty factors FD1 to FD3 included in the phase identification header H2 serves as, for example, information representing that the corresponding modified output signal ToutA is used for any one of the U-, V-, and W-phases.

The upper-arm drive ICs 70 are configured to be communicable with each other, and similarly, the lower-arm drive ICs 70 are configured to be communicable with each other.

The determination processor 70i of each upper-arm drive IC 70 is configured to transmit the modified output signal ToutA comprised of the phase identification header H2 representing the corresponding phase, and the cyclic pulse signal including the temperature TD of the corresponding switch to the microcomputer 40 via the switching circuit 70j upon determining that none of the determiners 70c to 70h has deter mined the occurrence of a corresponding failure (YES in step S10). In particular, the determination processors 70i of the respective upper-arm drive ICs 70 are configured to output the respective modified output signals ToutA while their signal transmitting periods are non-overlapped with each other.

Similarly, the determination processor 70i of each lower-arm drive IC 70 is configured to transmit the modified output signal ToutA comprised of the phase identification header H2 representing the corresponding phase, and the cyclic pulse signal including the temperature TD of the corresponding switch to the microcomputer 40 via the switching circuit 70j upon determining that none of the determiners 70c to 70h has determined the occurrence of a corresponding failure (YES in step S10). In particular, the determination processors 70i of the respective lower-arm drive ICs 70 are configured to output the respective modified output signals ToutA while their signal transmitting periods are non-overlapped with each other.

Otherwise, upon determining that one of the determiners 70c to 70h of one of the upper-arm drive ICs 70 has determined the occurrence of a corresponding failure (NO in step S10), the determination processor 70i of the failure-related drive IC 70 performs the operation in step S12, and causes the switching circuit 70j to output, from the second terminal C2 to the microcomputer 40, the modified output signal ToutA comprised of the phase identification header H2 and the output signal Tout modulated and/or adjusted to represent a corresponding occurred failure (see one of steps S13, S16, S18, S20, and S23). In contrast, the determination processor 70i of each of the failure-unrelated drive ICs 70 maintains the logical level of the failure signal FINV to the logical low level, and transmits a logical low-level signal from the corresponding second terminal C2.

Similarly, upon determining that one of the determiners 70c to 70h of one of the lower-arm drive ICs 70 has determined the occurrence of a corresponding failure (NO in step S10), the determination processor 70i of the failure-related drive IC 70 performs the operation in step S12, and causes the switching circuit 70j to output, from the second terminal C2 to the microcomputer 40, the modified output signal ToutA comprised of the phase identification header H2 and the output signal Tout modulated and/or adjusted to represent a corresponding occurred failure (see one of steps S13, S16, S18, S20, and S23). In contrast, the determination processor 70i of each of the failure-unrelated drive ICs 70 maintains the logical level of the failure signal FINV to the logical low level, and transmits a logical low-level signal from the corresponding second terminal C2.

Figure 17:
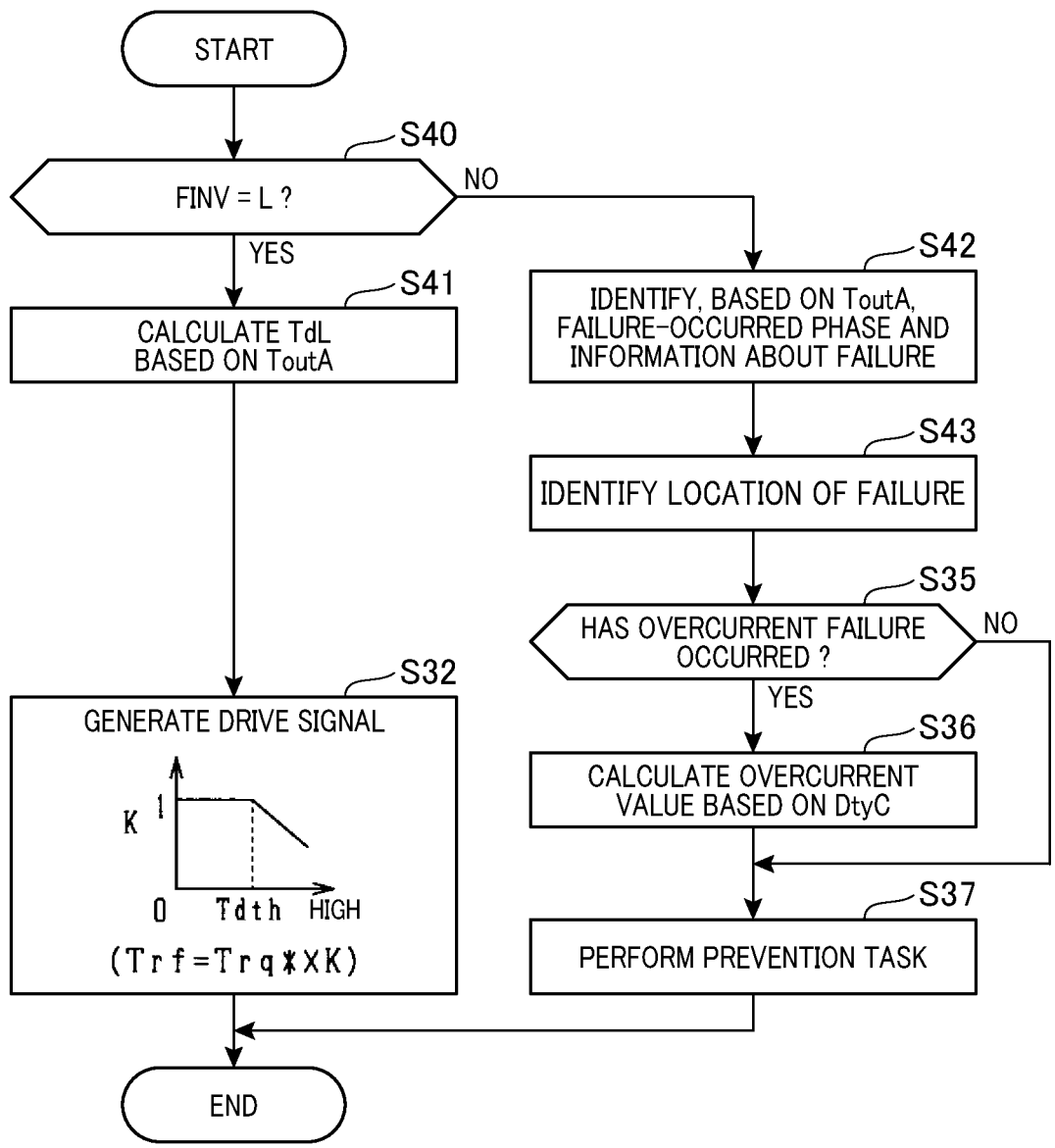
FIG. 17 is a flowchart schematically illustrating a drive control and failure identification routine carried out by a microprocessor according to the second embodiment.

Next, the following describes a drive control routine carried out by the microcomputer 40 according to the second embodiment with reference to FIG. 17. The microcomputer 40 is programmed to perform the drive control routine every predetermined control period. Note that common step numbers are each assigned to a corresponding set of similar operations between the procedure illustrated in FIG. 13 and the procedure illustrated in FIG. 17, so that descriptions of the similar operations are omitted.

When starting the drive control routine, the microcomputer 40 determines whether each of the failure signals FINV sent from all the drive ICs 70 through the third transmitters 60c1 and 60c2 has the logical low level in step S40.

Upon it being determined that each of the failure signals FINV sent from all the drive ICs 70 has the logical low level (YES in step S40), the microcomputer 40 determines that each of the determiners 70c to 70h has determined there are no failures associated with the corresponding switch. Then, the drive control routine proceeds to step S41.

In step S41, the microcomputer 40 checks the phase identification header H2 of each modified output signal ToutA sent from the corresponding second terminal C2 of the corresponding one of the drive ICs 70 to thereby identifying the phase of each modified output signal ToutA. Then, the microcomputer 40 detects the temperature TD of each of the switches SUH, SUL, SVH, SVL, SWH, and SWL in accordance with the duty factor Duty of the corresponding one of the modified output signals ToutA sent from the corresponding second terminal C2 of the corresponding one of the drive ICs 70 in step S41.

Next, the microcomputer 40 selects, from the detected temperatures TD of all the switches SUH, SUL, SVH, SVL, SWH, and SWL, the highest one of the detected temperatures as a control temperature TdL in step S41 in the same manner as the operation in step S31.

On the other hand, upon it being determined that one of the failure signals FINV sent from all the drive ICs 70 has the logical high level (NO in step S40), the microcomputer 40 determines that a failure associated with one of the drive ICs 70 corresponding to the logical high-level failure signal FINV has occurred in step S40. Hereinafter, one of the drive ICs 70 corresponding to the logical high-level failure signal FINV will be referred to as a failure-related drive IC 70.

Following the determination in step S40, the microcomputer 40 identifies, based on the phase identification header H2 of the modified output signal ToutA sent from the corresponding second terminal C2 of the failure-related drive IC 70, the phase of the failure-related drive IC 70 in step S43. In step S43, the microcomputer 40 also identifies, based on the modified output signal ToutA sent from the corresponding second terminal C2 of the failure-related drive IC 70, information about the occurred failure in step S43.

More specifically, in step S43, the microcomputer 40 checks one of the third transmitters 60c1 and 60c2 through which the logical high-level failure signal FINV has been transmitted to thereby identify that the failure-related drive IC 70 is one of an upper-arm drive IC 70 and a lower-arm drive IC 70. In addition, in step S43, the microcomputer 40 identifies the phase of the failure-related drive IC 70 in accordance with the phase identification header H2 of the modified output signal ToutA sent from the corresponding second terminal C2 of the failure-related drive IC 70 in step S43.

As described above, the second embodiment obtains substantially the same the technical effects as those obtained by the first embodiment while lowering the number of second transmitters 60b1 and 60b2 and the number of third transmitters 60c1 and 60c2.

Modifications of Second Embodiment

As described above, the determination processor 70i of each of the failure-unrelated drive ICs 70 maintains the logical level of the failure signal FINV to the logical low level.

Figure 18A:
FIG. 18A is a diagram schematically illustrating a failure signal according to a modification of the second embodiment.
Figure 18B:
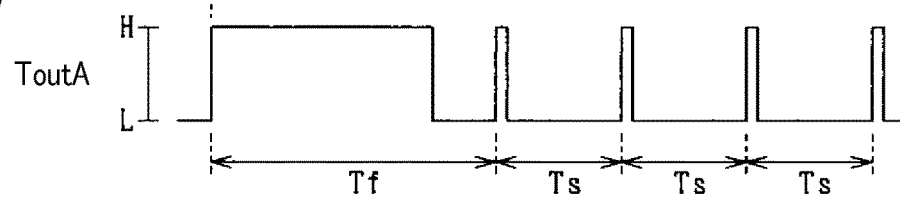
FIG. 18B is a diagram schematically illustrating how the overheating failure of a switch is informed according to the modification of the second embodiment.

In contrast, upon determining that one of the determiners 70c to 70h of one of the upper- and lower-arm drive ICs 70 has determined the occurrence of a corresponding failure (NO in step S10), the determination processor 70i of the failure-related drive IC 70 can transmit, as the failure signal FINV, a pulse signal from the third terminal C3 as illustrated in FIG. 18A. FIG. 18A illustrates a pulse signal having two pulses with an interval Tp therebetween as an example of the failure signal FINV. Note that FIG. 18B illustrates the modified output signal ToutA transmitted from the second terminal C2 of each drive IC 70 upon it being determined that an overheating failure of the corresponding switch has occurred as illustrated in FIG. 16. FIGS. 18A and 18B show that the length TfA of the phase identification header H2 is set to be longer than the interval Tp of the pulses of the pulse signal FINV. This feature enables the microcomputer 40 to recognize the occurrence of a failure associated with a switch based on the pulse signal FINV earlier than identification of the phase associated with the occurred failure and earlier than information about the occurred failure based on the modified output signal ToutA.

Figure 19:
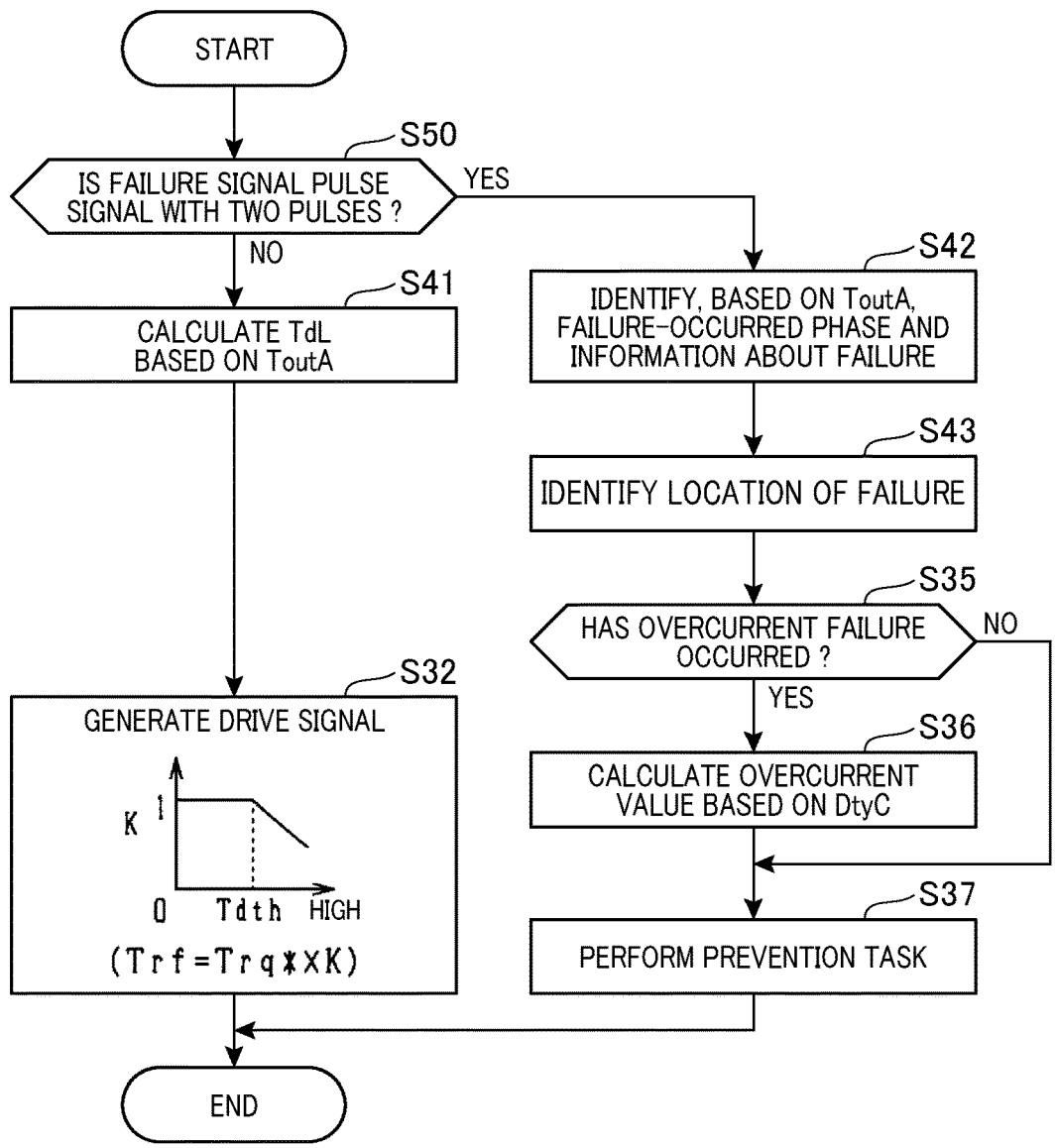
FIG. 19 is a flowchart schematically illustrating a drive control and failure identification routine carried out by a microprocessor according to the second embodiment.

Next, the following describes a drive control routine carried out by the microcomputer 40 according to the modification of the second embodiment with reference to FIG. 19. The microcomputer 40 is programmed to perform the drive control routine every predetermined control period. Note that common step numbers are each assigned to a corresponding set of similar operations between the procedure illustrated in FIG. 17 and the procedure illustrated in FIG. 19, so that descriptions of the similar operations are omitted.

When starting the drive control routine, the microcomputer 40 determines whether each of the failure signals FINV sent from all the drive ICs 70 through the third transmitters 60c1 and 60c2 is the pulse signal having two pulses in step S50. Upon determining that each of the failure signals FINV sent from all the drive ICs 70 is not the pulse signal having two pulses (NO in step S50), the microcomputer 40 determines that each of the determiners 70c to 70h has determined there are no failures associated with the corresponding switch. Then, the drive control routine proceeds to step S41.

Otherwise, upon it being determined that one of the failure signals FINV sent from all the drive ICs 70 is the pulse signal having two pulses (YES in step S50), the microcomputer 40 determines that a failure associated with one of the drive ICs 70 corresponding to the pulse signal having two pulses has occurred in step S50. Then, the microcomputer 40 performs the operation in step S42.

That is, this modification of the second embodiment additionally obtains a technical effect that enables the microcomputer 40 to recognize the occurrence of a failure associated with a switch based on the pulse signal FINV earlier than identification of the phase associated with the occurred failure and earlier than information about the occurred failure based on the modified output signal ToutA.

Third Embodiment

Figure 20:
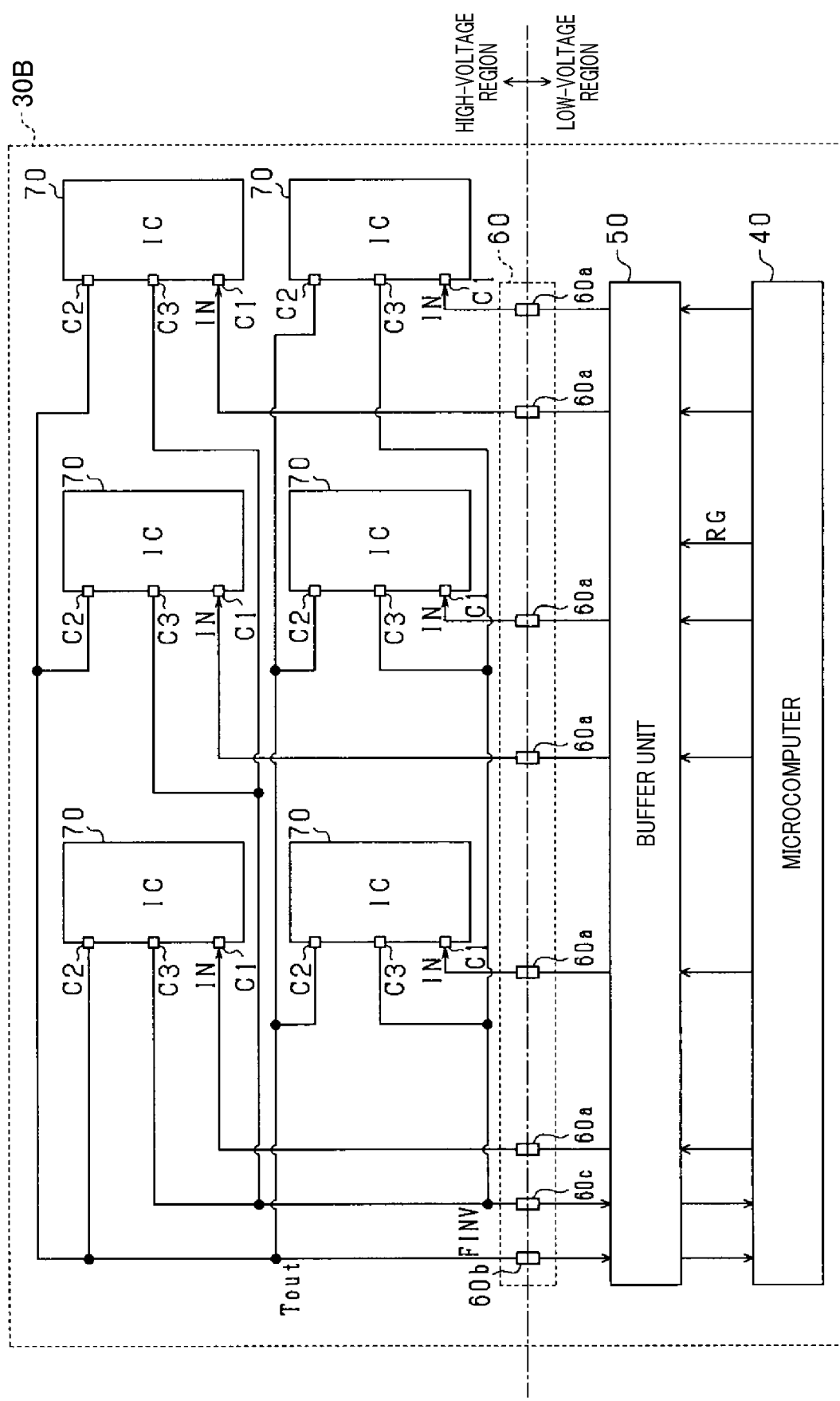
FIG. 20 is a circuit diagram schematically illustrating an example of the structure of a control circuit according the third embodiment of the present disclosure.
Figure 21:
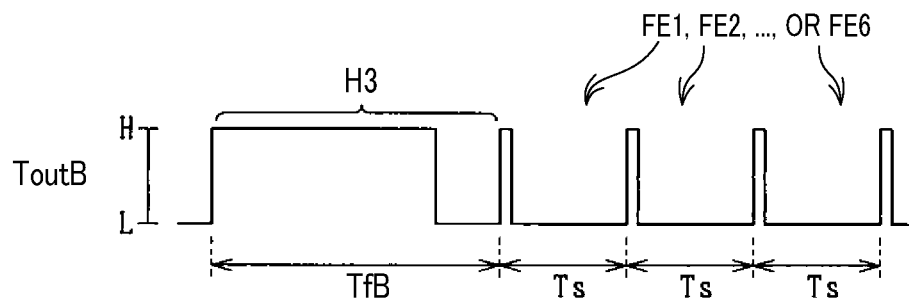
FIG. 21 is a diagram schematically illustrating how the overheating failure of a switch is informed according to the third embodiment.
Figure 22:
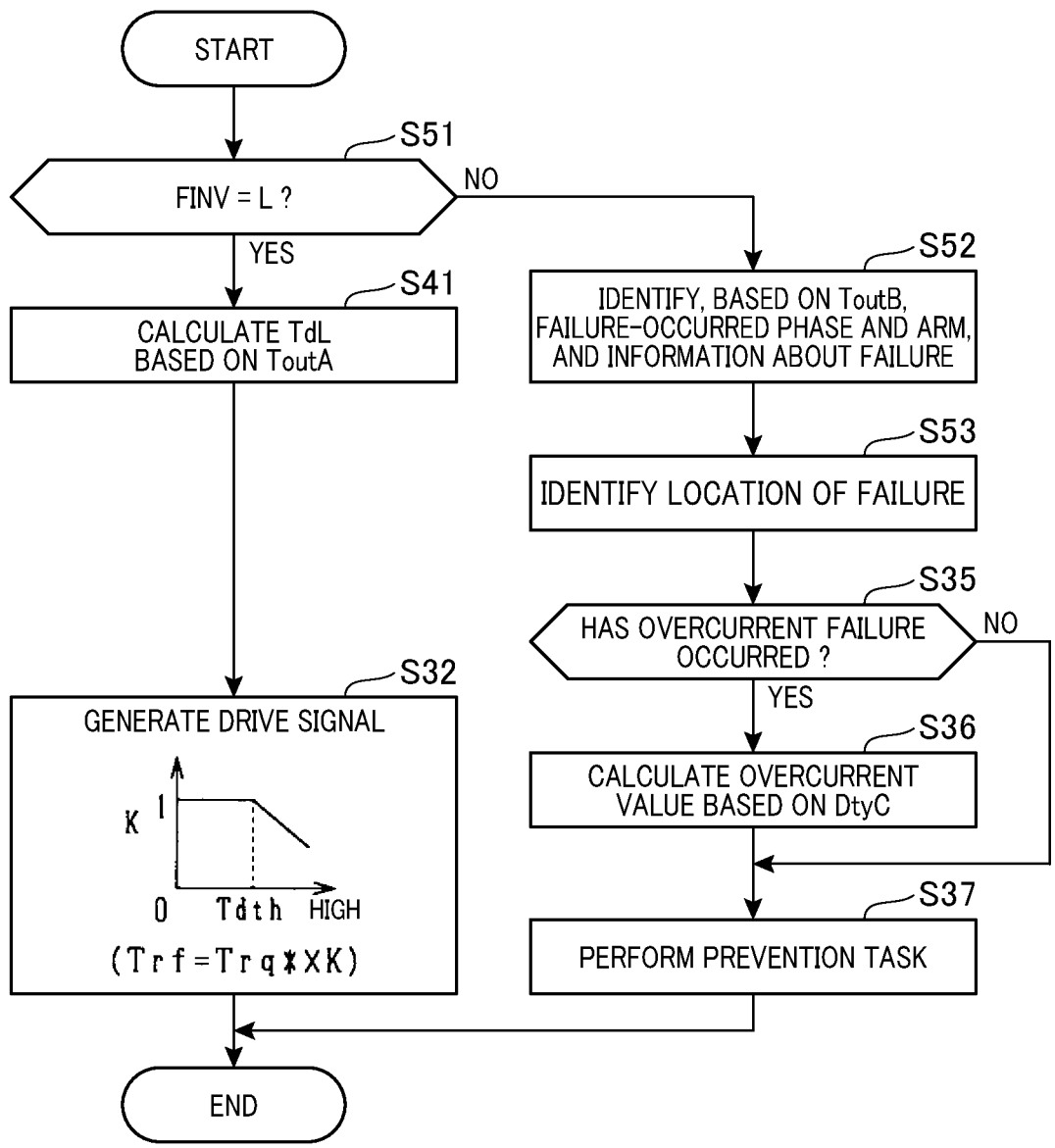
FIG. 22 is a flowchart schematically illustrating a drive control and failure identification routine carried out by a microprocessor according to the third embodiment.

The following describes the third embodiment of the present disclosure with reference to FIGS. 20 to 22. FIG. 20 schematically illustrates a control circuit 30B according to the third embodiment. The structures and/or functions of the control circuit 30B according to the third embodiment are different from those of the control circuit 30A according to the second embodiment by the following points. So, the following mainly describes the different points, and omits or simplifies descriptions of like parts between the second and third embodiments, to which identical or like reference characters are assigned, thus eliminating redundant description.

Referring to FIG. 20, the control circuit 30B is configured such that the second terminals C2 of all the drive ICs 70 are commonly connected to a single common second transmitter 60bb, so that the second terminals C2 of the drive ICs 70 are commonly communicable with the microcomputer 40 via the common second transmitter 60bb.

In addition, the control circuit 30B is configured such that the third terminals C3 of all the drive ICs 70 are commonly connected to a single common third transmitter 60*cc*, so that the third terminals C3 of all the drive ICs 70 are commonly communicable with the microcomputer 40 via the common third transmitter 60*cc*.

Next, the following describes a failure communication task carried out by the determination processor 70*i* in each of the operations in steps S14, S16, S18, S20, and S23 of FIG. 6.

Specifically, in each of steps S14, 16, 18, S20, and S23, the determination processor 70*i* causes the switching circuit 70*j* to output a modified output signal ToutB, which is comprised of an identification header H3 prefixed to the corresponding one of the output signals Tout that are illustrated in respective FIGS. 7 to 12.

For example, FIG. 21 schematically illustrates the modified output signal ToutB transmitted from the second terminal C2 of each drive IC 70 upon it being determined that an overheating failure of the corresponding switch has occurred.

Specifically, the identification header H3 assigned to the modified output signal ToutB transmitted from the determination processor 70*i* for the U-phase upper-arm switch has an on pulse and an off pulse within a predetermined length TfB, and has a predetermined first duty factor FE1 set for the U-phase upper-arm. Similarly, the identification header H3 for the U-phase lower-arm switch has a predetermined second duty factor FE2.

Additionally, the identification header H3 for the V-phase upper-arm switch has a predetermined third duty factor FE3 set for the V-phase upper-arm, and the identification header H3 for the V-phase lower-arm switch has a predetermined fourth duty factor FE4 set for the V-phase lower-arm.

The identification header H3 for the W-phase upper-arm switch has a predetermined fifth duty factor FE5 set for the W-phase upper-arm, and the identification header H3 for the W-phase lower-arm switch has a predetermined sixth duty factor FE6 set for the W-phase lower-arm.

That is, any of the duty factors FE1 to FE6, which are set to be different from each other, included in the identification header H3 serves as, for example, information representing that the corresponding modified output signal ToutB is used for any one of the U-, V-, and W-phases and any one of the upper- and lower-arms.

All the drive ICs 70 are configured to be communicable with each other.

The determination processor 70*i* of each drive IC 70 is configured to transmit the modified output signal ToutB comprised of the phase identification header H3 representing the corresponding phase and arm, and the cyclic pulse signal including the temperature TD of the corresponding switch to the microcomputer 40 via the switching circuit 70*j* upon determining that none of the determiners 70*c* to 70*h* has determined the occurrence of a corresponding failure (YES in step S10). In particular, the determination processors 70*i* of the respective drive ICs 70 are configured to output the respective modified output signals ToutB while their signal transmitting periods are non-overlapped with each other.

Otherwise, upon determining that one of the determiners 70*c* to 70*h* of one of the drive ICs 70 has determined the occurrence of a corresponding failure (NO in step S10), the determination processor 70*i* of the failure-related drive IC 70 performs the operation in step S12, and causes the switching circuit 70*j* to output, from the second terminal C2 to the microcomputer 40, the modified output signal ToutB comprised of the phase identification header H3 and the output signal Tout modulated and/or adjusted to represent a corresponding occurred failure (see one of steps S13, S16, S18, S20, and S23). In contrast, the determination processor 70*i* of each of the failure-unrelated drive ICs 70 maintains the logical level of the failure signal FINV to the logical low level, and transmits a logical low-level signal from the corresponding second terminal C2.

Next, the following describes a drive control routine carried out by the microcomputer 40 according to the third embodiment with reference to FIG. 22. The microcomputer 40 is programmed to perform the drive control routine every predetermined control period. Note that common step numbers are each assigned to a corresponding set of similar operations between the procedure illustrated in FIG. 17 and the procedure illustrated in FIG. 22, so that descriptions of the similar operations are omitted.

When starting the drive control routine, the microcomputer 40 determines whether each of the failure signals FINV sent from all the drive ICs 70 through the third transmitter 60*cc* has the logical low level in step S51.

Upon it being determined that each of the failure signals FINV sent from all the drive ICs 70 has the logical low level (YES in step S51), the microcomputer 40 determines that each of the determiners 70*c* to 70*h* has determined there are no failures associated with the corresponding switch. Then, the drive control routine proceeds to step S41.

Otherwise, upon determining that one of the failure signals FINV sent from all the drive ICs 70 has the logical high level (NO in step S51), the microcomputer 40 determines that a failure associated with one of the drive ICs 70 corresponding to the logical high-level failure signal FINV has occurred in step S51. Hereinafter, one of the drive ICs 70 corresponding to the logical high-level failure signal FINV will be referred to as a failure-related drive IC 70.

Following the determination in step S51, the microcomputer 40 identifies, based on the phase identification header H3 of the modified output signal ToutB sent from the corresponding second terminal C2 of the failure-related drive IC 70, the phase and arm of the failure-related drive IC 70 in step S53. In step S53, the microcomputer 40 also identifies, based on the modified output signal ToutB sent from the corresponding second terminal C2 of the failure-related drive IC 70, information about the occurred failure in step S53.

More specifically, in step S53, the microcomputer 40 identifies the phase and arm of the failure-related drive IC 70 in accordance with the phase identification header H3 of the modified output signal ToutB sent from the corresponding second terminal C2 of the failure-related drive IC 70 in step S53.

As described above, the third embodiment obtains substantially the same the technical effects as those obtained by the first embodiment while having a lower second transmitter 60*bb* and a lower third transmitter 60*cc*.

Fourth Embodiment

Figure 23:
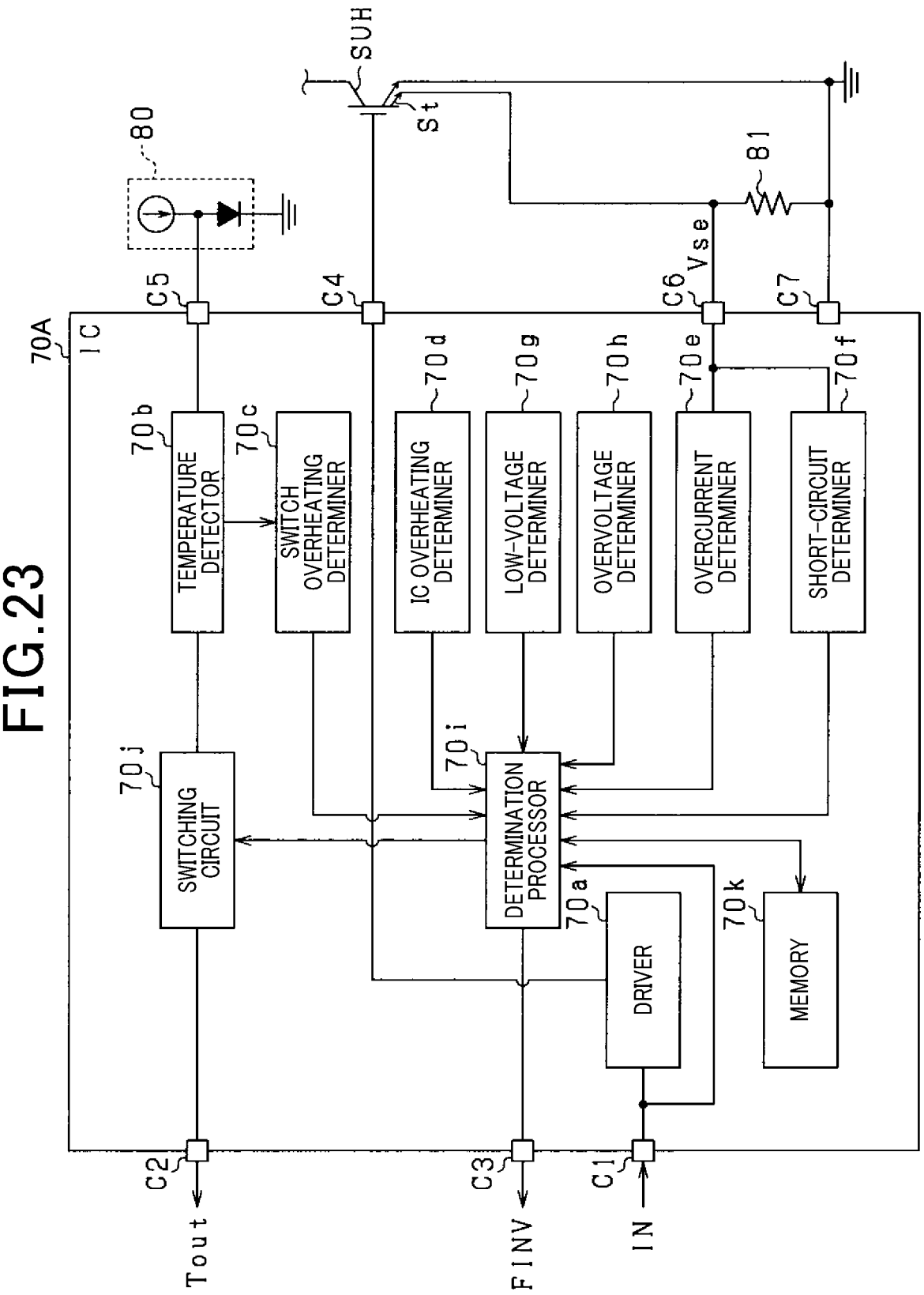
FIG. 23 is a block diagram schematically illustrating a drive IC and its peripheral units according to the fourth embodiment of the present disclosure.
Figure 24:
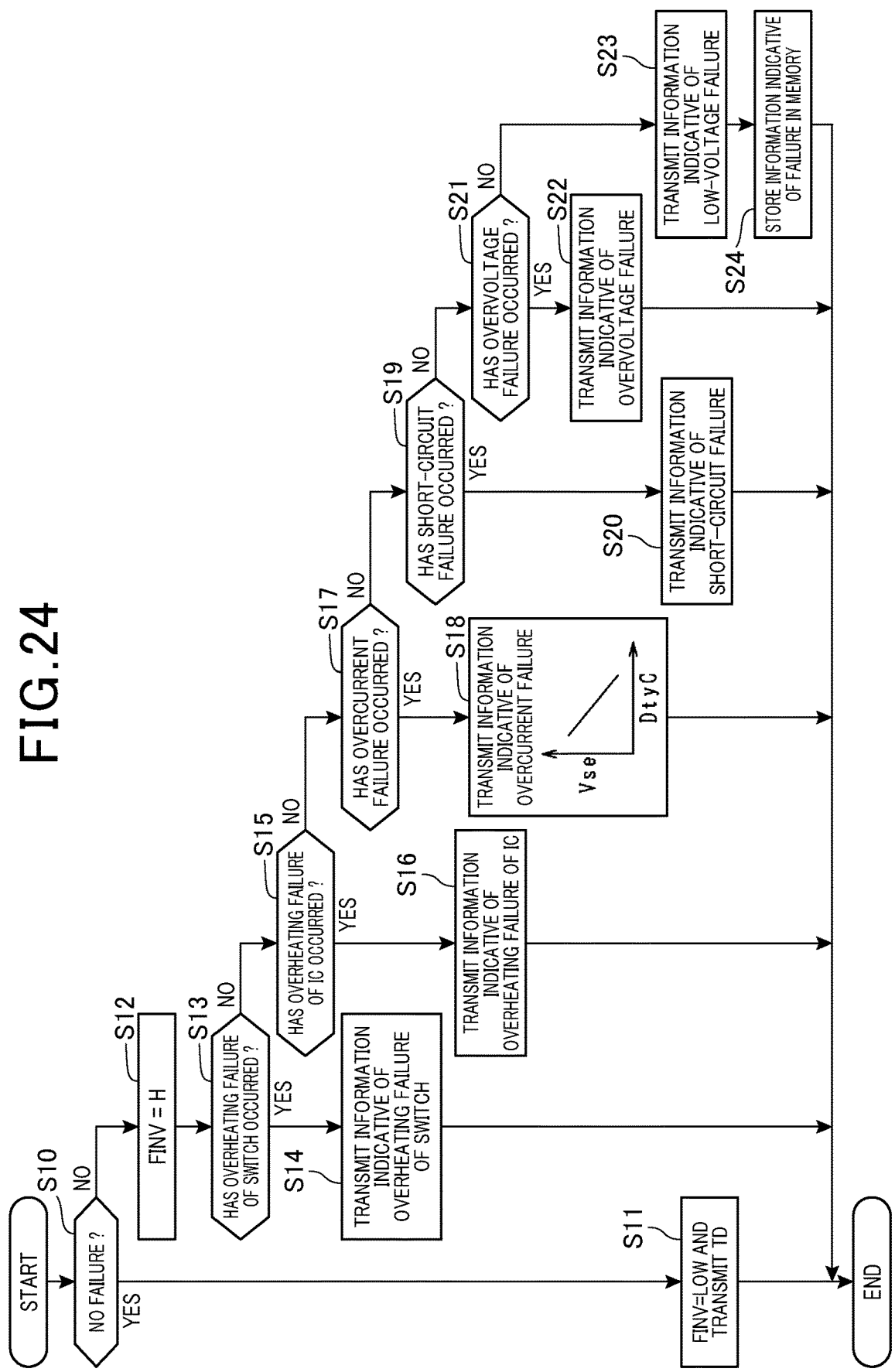
FIG. 24 is a flowchart schematically illustrating a failure determination routine carried out by a determination processor of each drive IC according to the fourth embodiment.
Figure 25:
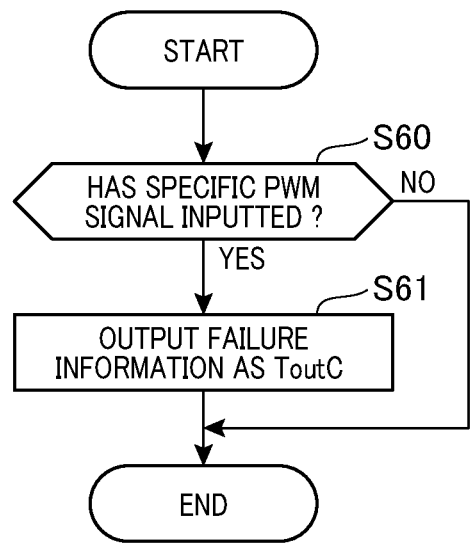
FIG. 25 is a flowchart schematically illustrating an ex-post failure-information transmission routine carried out by the determination processor of each drive IC according to the fourth embodiment.

The following describes the second embodiment of the present disclosure with reference to FIGS. 23 to 25. FIG. 23 schematically illustrates a drive IC 70A of a control circuit for each switch according to the fourth embodiment. The structures and/or functions of the control circuit according to the fourth embodiment are different from those of the control circuit 30 according to the first embodiment by the following points. So, the following mainly describes the different points, and omits or simplifies descriptions of like parts between the first and fourth embodiments, to which identical or like reference characters are assigned, thus eliminating redundant description.

Each drive IC 70A additionally includes a memory 70k operatively connected to the determination processor 70i. The determination processor 70i is configured to store information about an occurred failure upon determining that a failure associated with a switch has occurred.

Next, the following describes a failure determination routine carried out by the determination processor 70i of each drive IC 70A with reference to FIG. 24. The determination processor 70i of each drive IC 70A is programmed to perform the failure determination routine every predetermined control period. Note that common step numbers are each assigned to a corresponding set of similar operations between the procedure illustrated in FIG. 6 and the procedure illustrated in FIG. 24, so that descriptions of the similar operations are omitted.

When completing the operation in one of steps S14, S16, S18, S20, S22, and S23, the determination processor 70i stores, in the memory 70k, information indicative of the occurred failure in step S24. For example, upon determining that the occurred failure shows an overcurrent failure in step S20, the determination processor 70i stores failure information representing that the occurred failure is the overcurrent failure in the memory 70k.

In addition, the microcomputer 40 according to the fourth embodiment is configured to transmit, to the first terminal C1 of a selected one of the drive ICs 70, a specific PWM signal when requesting to know information indicative one or more failures associated with the selected drive IC 70 having occurred. The specific PWM signal having modulated on and off pulse patterns that cannot be used as the drive signals IN.

Next, the following describes an ex-post failure-information transmission routine carried out by the determination processor 70i of each drive IC 70A with reference to FIG. 25. The determination processor 70i, which has determined that a failure associated with the corresponding switch has occurred, is programmed to transmit a signal including the failure information representing an occurred failure from the second terminal C2 in response the specific PWM signal being input thereto.

When starting the ex-post failure-information transmission routine, the determination processor 70i of each drive IC 70A determines whether the specific PWM signal has inputted to the first terminal C1 sent from the microcomputer 40 in step S60.

Upon determining that the specific PWM signal has inputted to the first terminal C1 sent from the microcomputer 40 (YES in step S60), the determination processor 61 reads out the failure information stored in the memory 70k, and transmits the failure information from the second terminal C2 as the output signal Tout in step S61. Thereafter, the determination processor 40 terminates the ex-post failure-information transmission routine.

The fourth embodiment additionally obtains a technical effect that enables the microcomputer 40 to obtain, at a desired time, a failure history associated with a selected drive IC as useful information for designing a new control circuit for the inverter 20; the failure history represents what types of failures associated with the selected drive IC have occurred.

Modifications

The present disclosure is not limited to the above embodiments, and the above embodiments can be freely combined with each other or variably modified within the scope of the present disclosure.

In each of steps S14, S16, S18, S20, and S23, the determination processor 70i causes the switching circuit 70j to output a modified output signal ToutC, which is comprised of the corresponding one of the output signals Tout including at least one of (1) Information about a value of the sense voltage Vse obtained at the negative determination timing in step S10 of FIG. 6

(2) Information about a value of the temperature TD obtained at the negative determination timing in step S10 of FIG. 6

Figure 26:
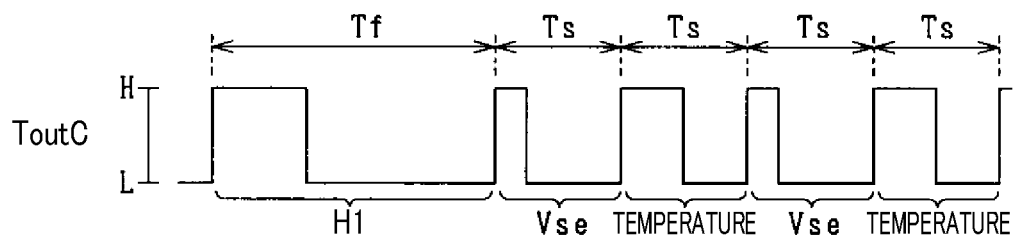
FIG. 26 is diagram schematically illustrating how the overheating failure of a switch is informed according to a modification of each embodiment.

For example, FIG. 26 schematically illustrates the modified output signal ToutC transmitted from the second terminal C2 of each drive IC 70 upon it being determined that an overheating failure of the corresponding drive IC 70 has occurred in step S15.

Specifically, the modified output signal ToutC is comprised of the on-off pulse header H1 including information indicative of the occurred failure being an overcurrent failure of the corresponding drive IC 70, and a cyclic pulse signal alternatively having a predetermined first duty factor FF1 and a predetermined second duty factor FF2 different from the first duty factor FF1.

The first duty factor FF1 represents the sense voltage Vse at the negative determination timing in step S10 of FIG. 6, and the second duty factor FF2 represents the temperature TD of the corresponding switch measured at the negative determination timing in step S10 of FIG. 6. Note that the on-off pulse header H1 has an on pulse and an off pulse within the length Tf that is longer than the interval Tp between the two pulses of the pulse signal included in the modified output signal ToutA (see FIG. 18A).

As described above, if the determination processor 70i wants to incorporate information at each of the sense voltage Vse and the temperature TD of the corresponding switch in the modified output signal ToutA illustrated in FIG. 15, the determination processor 70i modulates, in the cyclic pulse signal, at least the duty factor of the first pulse is modified to represent the sense voltage Vse, and the duty factor of the next second pulse is modified to represent the temperature TD of the corresponding switch.

An overheating failure of a switch, an overheating failure of a drive IC, an overcurrent failure, a short-circuit failure, an overvoltage failure, and a low-voltage failure are associated with the respective output signals Tout obtained in the respective operations S14, S16, S18, S20, S22, and S23. The present disclosure is however not limited to the above association. Specifically, each of an overheating failure of a switch, an overheating failure of a drive IC, an overcurrent failure, a short-circuit failure, an overvoltage failure, and a low-voltage failure can be associated with a corresponding one of the output signals Tout obtained in the respective operations S14, S16, S18, S20, S22, and S23.

The operation in step S32 uses the temperature TD of a switch as a parameter for correcting the drive signals, but can use another variable, such as a peak value of the emitter-collector voltage Vce, as the parameter for correcting the drive signals.

The on-off pulse header H1 of the modified output signal ToutA according to the second embodiment can include information indicative of whether the corresponding switch was in the on state or off state at the negative determination timing in step S10.

Other types of switches, such as MOSFETs, can be used as the switches of the inverter 20. If a MOSFET is used as each of the switches, the flyback diode D can be replaced with the intrinsic diode of the MOSFET.

The present disclosure is not limited to the three-phase inverter 20, and can be applied to multiphase inverters.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A drive apparatus, having a first region and a second region electrically isolated from the first region, for driving a target switch, the drive apparatus comprising:
    an obtaining unit mounted to the first region and configured to obtain a signal used for drive of the target switch, the signal representing a physical quantity associated with a physical characteristic of the target switch;
    a physical-quantity transmission terminal mounted to the first region;
    a modulator mounted to the first region and configured to perform pulse-width modulation of the signal obtained by the obtaining unit to thereby output a pulse signal from the physical-quantity transmission terminal;
    a failure information transmission terminal mounted to the first region;
    a failure determiner mounted to the first region and configured to determine whether a failure associated with the target switch has occurred;
    a transmission unit mounted to the first region and configured to stop transmission of the pulse signal from the physical-quantity transmission terminal, the transmission unit being configured to:
        transmit, from the failure information transmission terminal, a first signal indicative of an occurrence of the failure associated with the target switch when it is determined that the failure associated with the target switch has occurred; and
        transmit, from the physical-quantity transmission terminal, a second signal indicative of a content of the failure associated with the target switch; and
    a controller mounted to the second region and configured to:
        detect, based on the pulse signal from the physical-quantity transmission terminal, the physical quantity upon no input of the first signal to the controller; and
        identify, based on the second signal transmitted from the physical-quantity transmission terminal, the content of the failure upon the first signal being input to the controller.

2. The drive apparatus according to claim 1, wherein:
the modulator is configured to perform the pulse-width modulation of the signal obtained by the obtaining unit such that the pulse signal has a first duty factor that is associated with the physical quantity and that has a first range corresponding to a predetermined detection range of the physical quantity of the target switch;
the transmission unit is configured to transmit, as the second signal indicative of the content of the failure associated with the target switch, a second pulse signal having a second duty factor that is associated with the physical quantity and that has a second range outside the first range; and
the controller is configured to:
    detect, based on the first duty factor of the pulse signal from the physical-quantity transmission terminal, the physical quantity upon no input of the first signal to the controller; and
    identify, based on the second duty factor of the second pulse signal transmitted from the physical-quantity transmission terminal, the content of the failure upon the first signal being input to the controller.

3. The drive apparatus according to claim 1, wherein:
the controller is configured to:
    generate, based on the pulse signal from the physical-quantity transmission terminal, a drive signal for driving the target switch upon no input of the first signal to the controller; and
    generate the drive signal without using the pulse signal from the physical-quantity transmission terminal upon the first signal being input to the controller.

4. The drive apparatus according to claim 1, wherein:
the controller is configured to:
    generate and transmit a pulse-width modulated drive signal for driving the target switch; and
    generate and transmit a specific signal that is distinguished from the pulse-width modulated drive signal,
the drive apparatus further comprising:
a storage unit mounted to the first region; and
a drive signal input terminal mounted to the first region and configured receive the pulse-width modulated signal and the specific signal transmitted from the controller,
wherein:
the failure determiner is configured to store, in the storage unit, the content of the failure upon determining that the failure associated with the target switch has occurred; and
the transmission unit is configured to transmit, from the failure information transmission terminal, a signal indicative of the content of the failure stored in the storage unit when it is determined that the specific signal is input to the drive signal input terminal.

5. The drive apparatus according to claim 1, wherein:
the pulse signal output by the modulator has a first cycle;
the transmission unit is configured to transmit, as the second signal indicative of the content of the failure associated with the target switch, a second pulse signal having a second cycle that is different from the first cycle, and having a duty factor that is associated with the physical quantity and that has a range corresponding to a predetermined detection range of the physical quantity of the target switch; and
the controller is configured, upon the first signal being input to the controller, to:
    identify, based on the duty factor of the second pulse signal transmitted from the physical-quantity transmission terminal, the content of the failure; and
    detect, based on the cycle of the second pulse signal from the physical-quantity transmission terminal, the physical quantity.

6. The drive apparatus according to claim 1, wherein:
the transmission unit is configured to:
    transmit, from the failure information transmission terminal, a second pulse signal with a predetermined cycle as the first signal indicative of the occurrence of the failure associated with the target switch when it is determined that the failure associated with the target switch has occurred; and transmit, from the physical-quantity transmission terminal, a signal having a header with a predetermined length as the second signal, the header including the content of the failure associated with the target switch, the length of the header being set to be longer than the cycle of the second pulse signal.

7. The drive apparatus according to claim 1, wherein:
the switch comprises a first set of upper- and lower-arm switches, and a second set of upper- and lower-arm switches, the first and second phases respectively constituting plural phase of an inverter,
the drive apparatus further comprising:
  a first upper-arm integrated circuit provided for the upper-arm switch of the first phase;
  a second upper-arm integrated circuit provided for the upper-arm switch of the second phase;
  a first lower-arm integrated circuit provided for the lower-arm switch of the second phase; and
  a second lower-arm integrated circuit provided for the lower-arm switch of the second phase,
each of the first and second upper-arm integrated circuits and the first and second lower-arm integrated circuits comprising the obtaining unit, the physical-quantity transmission terminal, the modulator, the failure information transmission terminal, the failure determiner, and the transmission unit,
wherein:
the physical-quantity transmission terminals of the first and second upper-arm integrated circuits are communicable with the controller via a first common signal path;
the physical-quantity transmission terminals of the first and second lower-arm integrated circuits are communicable with the controller via a second common signal path; and
the transmission unit of each of the first and second upper-arm and lower-arm integrated circuits is configured to:
  transmit, from the failure information transmission terminal, a second pulse signal with a predetermined cycle as the first signal indicative of the occurrence of the failure associated with the target switch when it is determined that the failure associated with the target switch has occurred; and
  transmit, from the physical-quantity transmission terminal, a signal having a header with a predetermined length as the second signal, the header including the content of the failure associated with the target switch, and information indicative of the first or second phase of the corresponding one of the first and second upper-arm and lower-arm integrated circuits,
the length of the header being set to be longer than the cycle of the second pulse signal.

8. The drive apparatus according to claim 1, wherein:
the switch comprises a first set of upper- and lower-arm switches, and a second set of upper- and lower-arm switches, the first and second phases respectively constituting plural phase of an inverter,
the drive apparatus further comprising:
  a first upper-arm integrated circuit provided for the upper-arm switch of the first phase;
  a second upper-arm integrated circuit provided for the upper-arm switch of the second phase;
  a first lower-arm integrated circuit provided for the lower-arm switch of the second phase; and
  a second lower-arm integrated circuit provided for the lower-arm switch of the second phase,
each of the first and second upper-arm integrated circuits and the first and second lower-arm integrated circuits comprising the obtaining unit, the physical-quantity transmission terminal, the modulator, the failure information transmission terminal, the failure determiner, and the transmission unit,
wherein:
the physical-quantity transmission terminals of the first and second upper-arm integrated circuits are communicable with the controller via a first common signal path;
the physical-quantity transmission terminals of the first and second lower-arm integrated circuits are communicable with the controller via a second common signal path;
the modulator is configured to perform the pulse-width modulation of the signal obtained by the obtaining unit such that the pulse signal has a first duty factor that is associated with the physical quantity and that has a first range corresponding to a predetermined detection range of the physical quantity of the target switch; and
the transmission unit of each of the first and second upper-arm and lower-arm integrated circuits is configured to:
  transmit, from the failure information transmission terminal, the first signal indicative of the occurrence of the failure associated with the target switch when it is determined that the failure associated with the target switch has occurred; and
  transmit, from the physical-quantity transmission terminal, a signal comprising a header with a predetermined length, and a second pulse signal subsequent to the header as the second signal, the header including the content of the failure associated with the target switch, and information indicative of the first or second phase of the corresponding one of the first and second upper-arm and lower-arm integrated circuits,
the second pulse signal having a second duty factor that is associated with the physical quantity and that has a range outside the first range.

* * * * *